(12) United States Patent
Jinbo

(10) Patent No.: US 6,175,264 B1
(45) Date of Patent: Jan. 16, 2001

(54) CHARGE PUMP FOR GENERATING NEGATIVE VOLTAGE WITHOUT CHANGE OF THRESHOLD DUE TO UNDESIRABLE BACK-GATE BIASING EFFECT

(75) Inventor: Toshikatsu Jinbo, Tokyo (JP)

(73) Assignee: NEC Corporation, Tokyo (JP)

(*) Notice: Under 35 U.S.C. 154(b), the term of this patent shall be extended for 0 days.

(21) Appl. No.: 09/267,158

(22) Filed: Mar. 12, 1999

(30) Foreign Application Priority Data

Mar. 16, 1998 (JP) .................................................. 10-065817

(51) Int. Cl.[7] ................................. G05F 1/10; G05F 3/02
(52) U.S. Cl. ............................................. 327/536; 327/534
(58) Field of Search ..................................... 327/534, 535, 327/536, 537, 566

(56) References Cited

U.S. PATENT DOCUMENTS

| 5,489,870 | * | 2/1996 | Arakawa | 327/536 |
| 5,815,446 | * | 9/1998 | Tobita | 365/189.09 |
| 5,892,267 | * | 4/1999 | Takada | 327/536 |
| 6,046,626 | * | 4/2000 | Saeki et al. | 327/536 |

FOREIGN PATENT DOCUMENTS 8-103070   4/1996 (JP) .

OTHER PUBLICATIONS

A. Umezawa et al., "A 5-V-Only Operation 0.6-μm Flash EEPROM with Row Decoder Scheme in Triple-Well Structure", *IEEE Journal of Solid State Circuits*, vol. 27, No. 11, Nov. 1992, pp. 1540-1546.

* cited by examiner

Primary Examiner—Terry D. Cunningham
Assistant Examiner—Quan Tra
(74) Attorney, Agent, or Firm—Young & Thompson

(57) ABSTRACT

A boosting stage of a charge pump circuit has a boosting capacitor connected to a boosted node and an n-channel enhancement type field effect transistor connected between the boosted node and other node and fabricated on a p-type well connected to the other node, and the n-channel enhancement type field effect transistor turns on for discharging current from the other node to the boosted node through the conductive channel and the p-n junction between the p-type well and the n-type source node thereof so that the potential level at the p-type well restricts the back-gate biasing effect, thereby widely swinging the potential level at the other node.

14 Claims, 19 Drawing Sheets

CHARGE PUMP FOR GENERATING NEGATIVE VOLTAGE WITHOUT CHANGE OF THRESHOLD DUE TO UNDESIRABLE BACK-GATE BIASING EFFECT

FIELD OF THE INVENTION

This invention relates to a charge pump and, more particularly to a charge pump incorporated in a semiconductor non-volatile memory device such as, for example, an electrically erasable and programmable read only memory device and a semiconductor structure for the charge pump circuit.

DESCRIPTION OF THE RELATED ART

A flash-erase memory device is a kind of the electrically erasable and programmable read only memory device, and is abbreviated as "flash EEPROM" hereinbelow. FIG. 1 illustrates the structure of a standard nonvolatile memory cell incorporated in the flash EEPROM device. N-type source/drain regions 1/2 are formed in a p-type silicon substrate 3, and a tunnel gate oxide layer 4, a floating gate electrode 5, an interpoly oxide layer 6 and a control gate electrode 7 are laminated on a channel region between the n-type source region 1 and the n-type drain region 2.

The floating gate electrode 5 is electrically isolated from another conductive layer, and electron is accumulated in and evacuated from the floating gate electrode 5. If the electron is accumulated in the floating gate electrode 5, the accumulated electron induces holes in the channel region, and the memory cell has a high threshold with respect to the potential level on the control gate electrode 7. On the other hand, when the electron is evacuated from the floating gate electrode 5, the memory cell is recovered to a low threshold. When the memory cell is changed to the erased state, the n-type source region 1 and the control gate electrode 7 are, by way of example, biased to +5 volts and −10 volts, respectively, and the n-type drain region 2 is maintained in floating state. The two kinds of threshold are corresponding to the logic levels of a data bit. Thus, the data bit is stored in the form of the threshold of the memory cell.

FIG. 2 illustrates another kind of the non-volatile memory cell. A p-type well 11 is nested in an n-type well 12, which is formed in a surface portion of a p-type semiconductor substrate 13. A heavily-doped p-type region 14 and an heavily-doped n-type region 15 are respectively formed in the p-type well 11 and the n-type well 12, and both of the heavily-doped p-type region 14 and the heavily-doped n-type region 15 are electrically connected to each other.

An n-type source region 16 and an n-type drain region 17 are formed in the p-type well 11, and are spaced from each other. A tunnel gate oxide layer 18, a floating gate electrode 19, a interpoly oxide layer 20 and a control gate electrode 21 are stacked over the channel region between the n-type source region 16 and the n-type drain region 17.

The prior art non-volatile memory cell also changes the threshold depending upon the amount of electron accumulated in the floating gate electrode 19. When the electron is evacuated from the floating gate electrode, a negative potential Vg and a positive potential Vb are respectively applied to the control gate electrode 21 and the p-type well 11, and the accumulated electron flows through the tunnel gate oxide layer 18 to the p-type well 11. In this instance, the negative potential Vg is −10 volts, and the positive potential Vb is +5 volts.

Thus, the prior art non-volatile memory cells requires various bias voltages for rewriting the data bit stored therein. The ground voltage GND and the positive power voltage Vcc of 3 or 5 volts are supplied to the flash EEPROM device. However, the other bias voltage such as Vg=−10 volts is internally generated. The prior art flash EEPROM device is equipped with a charge pump circuit, and the charge pump circuit generates the negative voltage Vg.

A typical example of the charge pump circuit is disclosed in Japanese Patent Publication of Unexamined Application NO. 8-103070 and "A 5-V-Only Operation 0.6-$\mu$m Flash EEPROM with Row Decoder Scheme in Triple-Well Structure", IEEE Journal of Solid-State Circuit, vol. 27, No. 11, November 1992, pages 1540–1546. Those prior art charge pump circuits will be described hereinlater.

FIG. 3 illustrates the prior art charge pump circuit disclosed in the Japanese Patent Publication of Unexamined Application. P-channel enhancement type field effect transistors MP0/MP1/MP2/MP3/MP4 are connected in series between a ground line GND and an output node Vncp. The p-channel enhancement type field effect transistor MP0 has a gate electrode connected to the drain node thereof, and capacitors C1/C2/C3/C4 are associated to the p-channel enhancement type field effect transistors MP1/MP2/MP3/MP4. Each of the capacitor C1/C2/C3/C4 is connected to the gate electrode and the drain node of the associated p-channel enhancement type field effect transistor MP1/MP2/MP3/MP4. A clock signal FA is 180 degrees different in phase from another clock signal FB, and the clock signals FA and FB are supplied to the capacitors C1/C3 and the capacitors C2/C4, respectively.

The p-channel enhancement type field effect transistors MP0/MP1/MP2 are fabricated on an n-type well, and the other p-channel enhancement type field effect transistors MP3/MP4 are fabricated on another n-type well. A positive power voltage Vcc is supplied to the n-type well assigned to the p-channel enhancement type field effect transistors MP0/MP1/MP2, and the ground line is connected to the n-type well assigned to the other p-channel enhancement type field effect transistors MP3/MP4. The reason why the ground voltage is supplied to the n-type well assigned to the p-channel enhancement type field effect transistors MP3/MP4 is that the ground voltage restricts the increase of the threshold due to the back-gate biasing effect in the p-channel enhancement type field effect transistors MP3/MP4. As a result, the p-channel enhancement type field effect transistors MP3/MP4 do not widely reduce the boosting efficiency. Thus, the prior art charge pump circuit achieves a fairly good boosting efficiency by virtue of the ground voltage applied to the n-type well assigned to the p-channel enhancement type field effect transistors MP3/MP4.

In operation, the clock signals FA/FB are alternated between the positive power voltage Vcc and the ground level GND as shown in FIG. 4. When the clock signal FA is changed from the ground level GND to the positive power voltage Vcc and, thereafter, vice versa, the other clock signal FB is changed from the positive power voltage Vcc to the ground level and vice versa. Thus, the clock signal FA is 180 degrees different in phase from the other clock signal FB. The capacitors C1/C2/C3/C4 cooperate with the parasitic capacitors of the p-channel enhancement type field effect transistors MP1/MP2/MP3/MP4, respectively, and the capacitors C1–C4 and the associated p-channel enhancement type Field effect transistors MP1–MP4 form four boosting stages. The clock signals FA/FB cause the four stages to stepwise boost the potential level at the drain nodes, and the boosting stages produce a negative voltage at the output node Vncp.

FIG. 5 illustrates the prior art charge pump circuit disclosed in the IEEE Journal of Solid-State. P-channel enhancement type field effect transistors MP1/MP2/MP3/ MP4/MP5 are connected in series between a ground line GND and an output node Vncp, and other p-channel enhancement type field effect transistors MP11/MP12/ MP13/MP14 are connected between the gate electrodes of the p-channel enhancement type field effect transistors MP1/ MP2/MP3/MP4 and the associated drain nodes thereof. Capacitors C1/C2/C3/C4 are connected to the gate electrodes of the p-channel enhancement type field effect transistors MP11/MP12/MP13/MP14 and to the drain nodes of the p-channel enhancement type field effect transistors MP2/ MP3/MP4/MP5. Other capacitors C11/C12/C13/C14 are connected to the gate electrodes of the p-channel enhancement type field effect transistors MP1/MP2/MP3/MP4, respectively.

Clock signals F1/F2/F3/F4 are supplied to the capacitors C2/C4, the capacitors C11/C13, the capacitors C1/C3 and the capacitors C12/C14, respectively. The clock signals F1/F2/F3/F4 are different in duty factor from one another (see FIG. 6), and the clock signals F1/F2 are oppositely changed between the positive power voltage Vcc and the ground level with respect to the other clock signals F3/F4.

Comparing FIG. 5 with FIG. 3, the second prior art charge pump circuit shown in FIG. 5 is rather complicated. The capacitors C1 to C4 and the p-channel enhancement type field effect transistors MP11 to MP14 are added to the first prior art charge pump circuit shown in FIG. 3. The capacitors C1–C4 and the p-channel enhancement type field effect transistors MP11–MP14 make the circuit configuration of the second prior art charge pump circuit complicated. However, those additional circuit components C1–C4 and MP11–MP14 allow the clock signals F2/F4 to widely swing the gate potential at the gate electrodes of the p-channel enhancement type field effect transistors MP11–MP14, and the widely swung gate potential partially compensates the increase of the threshold due to the back-gate biasing effect in the p-channel enhancement type field effect transistors MP1–MP4. Thus, the additional components C1–C4 and MP11–MP14 prevent the p-channel enhancement type field effect transistors MP11–MP14 from serious reduction of boosting efficiency due to the back-gate biasing effect.

Both prior art charge pump circuits achieve fairly good boosting efficiency. However, the ground voltage GND and the additional circuit components C1–C4/MP11–MP14 can not perfectly compensate the increase of the threshold due to the back-gate biasing effect in the p-channel enhancement type field effect transistors. Even though the ground voltage GND is applied to the n-type well assigned to the p-channel enhancement type field effect transistors MP3/MP4, the negative boosted voltage of –10 volts is equivalent to the back-gate bias of 10 volts in the last p-channel enhancement type field effect transistor MP4, and the reduction of boosting efficiency is not ignoreable. Although the additional circuit components C1–C4/MP11–MP14 increases the amplitude of the gate potential, it is impossible to perfectly compensate the increase of the threshold due to the back-gate biasing effect.

The larger the negative boosted voltage is, the wider the reduction of the boosting efficiency is. Moreover, when the circuit designer reduces the amplitude of the clock signals, the reduction of the boosting efficiency becomes serious.

SUMMARY OF THE INVENTION

It is therefore an important object of the present invention to provide a charge pump circuit, which is improved in boosting characteristics.

To accomplish the object, the present invention proposes to isolate back gates of field effect transistors from one another for independently change the potential levels at the back gates.

In accordance with one aspect of the present invention, there is provided a charge pump circuit comprising a plurality of nodes independently variable in potential level, a diode circuit including a first field effect transistor connected between one of the plurality of nodes and a source of constant voltage and having a first back gate connected to the aforesaid one of the plurality of nodes and supplied with a first potential for restricting a back-gate biasing effect in the first field effect transistor and a first gate electrode connected to the aforesaid one of the plurality of nodes and responsive to the first potential for creating a first current path from the aforesaid one of the plurality of nodes to the source of constant voltage and a plurality of boosting stages connected in series between the plurality of nodes and responsive to first clock signals for selectively boosting potentials at the plurality of nodes and selectively discharging the potentials toward the diode circuit, and each of the plurality of boosting stages includes a second field effect transistor connected between two nodes selected from the plurality of nodes and having a second back gate electrically isolated from the first back gate, connected to one of the two nodes farther from the aforesaid one of the plurality of nodes than the other of the two nodes and supplied with a second potential independently varied for restricting the back-gate biasing effect in the second field effect transistor and a second gate electrode connected to the aforesaid one of the two nodes and responsive to the second potential for creating a second current path from the aforesaid one of the two nodes to the other of the two nodes and a first capacitor connected to the other of the two nodes and responsive to one of the first clock signals for boosting the potential at the other of the two nodes.

BRIEF DESCRIPTION OF THE DRAWINGS

The features and advantages of the charge pump will be more clearly understood from the following description taken in conjunction with the accompanying drawings in which.

DESCRIPTION OF THE PREFERRED EMBODIMENTS

First Embodiment

Figure 7:
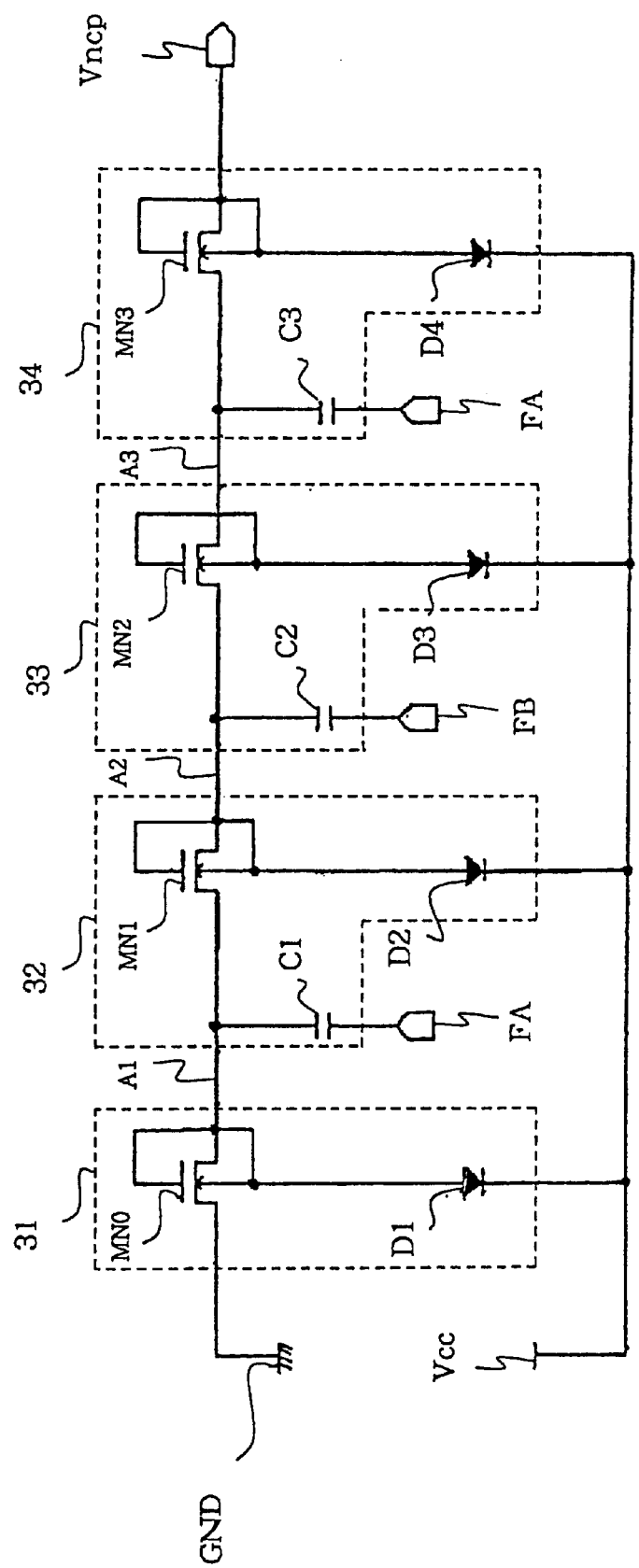
FIG. 7 is a circuit diagram showing the circuit configuration of a charge pump circuit according to the present invention.

FIG. 7 illustrates a charge pump circuit embodying the present invention. The charge pump circuit comprises an input diode circuit 31 and plural boosting stages 32/33/34 connected in series between a ground line GND and an output node Vncp. Reference A1 designates a boosted node between the input diode circuit 31 and the boosting stage 32, and boosted nodes between the boosting stages 32/33/34 are respectively labeled with references A2/A3. The input diode circuit 31 discharges electric charges from the boosted node A1 to the ground line GND, and blocks the boosted node A1 from the ground line GND. Thus, the input diode circuit 31 allows the electric charge to flow from the boosted node A1 to the ground line GND. On the other hand, each of the boosting stages 32/33/34 raises the potential level at the boosted node A1/A2/A3, and serves as a diode circuit between the boosted nodes A1 and A2, between A2 and A3 or between the boosted node A3 and the output node Vncp. Namely, the boosting stage 32/33/34 allows the electric charge to flow from the boosted node A2/A3 or the output node Vncp to the boosted node A1/A2/A3, and blocks the boosted node A2/A3 or the output node Vncp from the other boosted node A1/A2/A3.

The charge pump circuit forms a part of an electrically erasable and programmable read only memory cells. The electrically erasable and programmable read only memory cells are similar in structure to the prior art memory cell shown in FIG. 1 or 2, and the charge pump circuit supplies a negative potential to the control gate electrodes of the electrically erasable and programmable read only memory cells for evacuating accumulated electron. Other peripheral circuits of the electrically erasable and programmable read only memory device is well known to a person skilled in the art, and no further description is incorporated hereinbelow.

The input diode circuit 31 includes an n-channel enhancement type field effect transistor MN0 and a diode D1. The n-channel enhancement type field effect transistor MN0 has a gate electrode and a back gate connected to a drain node thereof, and the diode D1 is connected between the back gate and a positive power supply line Vcc. The anode and the cathode are connected to the back gate and the positive power voltage line Vcc, respectively.

The boosting stages 32/33/34 are similar in circuit configuration to one another. The boosting stages 32/33/34 includes an n-channel enhancement type field effect transistor MN1/MN2/MN3, a capacitor C1/C2/C3 connected to the source node of the associated n-channel enhancement type field effect transistor MN1/MN2/MN3 and a diode D2/D3/D4 connected between the back gate of the associated n-channel enhancement type field effect transistor MN1/MN2/MN3 and the positive power supply line Vcc. The gate electrode and the back gate of the n-channel enhancement type field effect transistor MN1/MN2/MNN3 are connected to the drain node thereof. The anode and the cathode of the diode D2/D3/D4 are connected to the back gate and the positive power supply line Vcc, respectively. Clock signals FA/FB are supplied to the capacitors C1/C3 and the capacitor C2, respectively, and are 180 degrees different in phase from each other.

Figure 8:
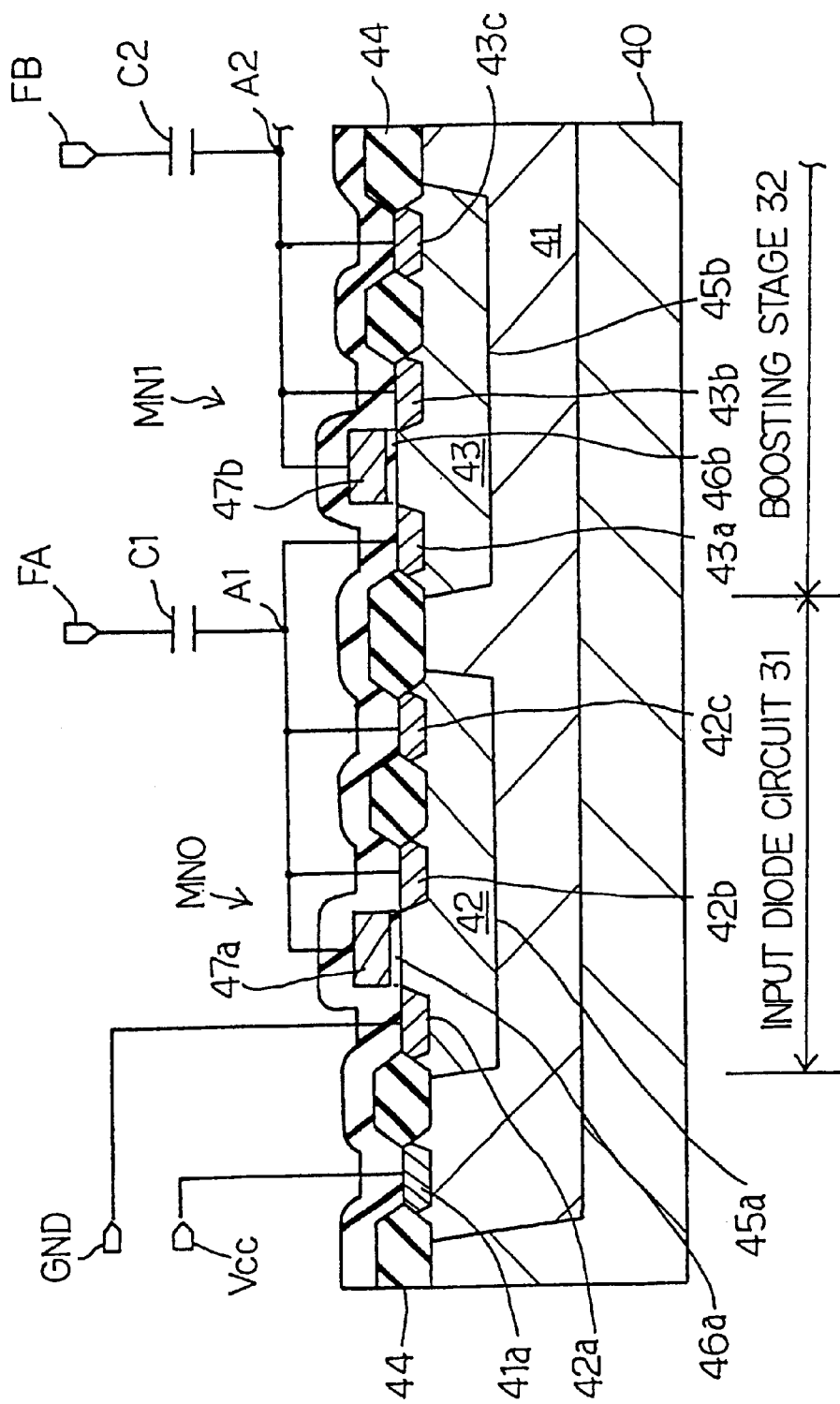
FIG. 8 is a cross sectional view showing the structure of a semiconductor integrated circuit device with the charge pump circuit.

FIG. 8 illustrates the structure of the charge pump circuit integrated on a semiconductor substrate 40. The charge pump circuit forms a part of an integrated circuit device such as, for example, a flash EEPROM device. In this instance, the semiconductor substrate 40 is formed of p-type silicon. An n-type well 41 is formed in a surface portion of the semiconductor substrate 40, and p-type wells 42/43 are formed in the n-type well 41. The n-type well 41 electrically isolates the p-type wells 42/43 from the p-type semiconductor substrate 40. The p-type wells 42/43 are spaced from each other, and a thick filed oxide layer 44 are selectively grown so as to offer electrical insulation between the n-type well 41 and the p-type wells 42 and 43.

The p-type wells 42/43 are assigned to the input diode circuit 31 and the boosting stage 32, respectively. Although other p-type wells are further formed in the n-type well 41 for the other boosting stages 33/34, they are not shown in FIG. 8 for the sake of simplicity. A heavily-doped n-type impurity region 41a is formed in another surface portion of the n-type well 41, and the positive power voltage Vcc is held in contact with the heavily-doped n-type impurity region 41a. The positive power supply voltage Vcc is supplied through the heavily-doped n-type impurity region 41a to the n-type well 41.

A p-n junction 45a between the n-type well 41 and the p-type well 42 serves as the diode D1, and the p-type well 42 per se serves as the back gate of the n-channel enhancement type field effect transistor MN0. N-type impurity regions 42a/42b are formed in the p-type well 42, and are spaced from each other. A thin gate insulating layer 46a is grown on the p-type well 42 between the n-type impurity regions 42a/42b, and a conductive line 47a extends over the thin gate insulating layer 46a. The n-type impurity regions 42a/42b and a part of the conductive line 47a serve as the source/drain nodes and the gate electrode of the n-channel enhancement type field effect transistor MN0. The ground line GND is connected to the n-type impurity region 42a.

A heavily-doped p-type impurity region 42c is formed in another surface portion of the p-type well 42c, and the capacitor C1 is connected to the conductive line 47a, the n-type impurity region 42b and the heavily-doped p-type impurity region 42c. The clock signal FA is supplied to the other electrode of the capacitor C1.

The p-type well 43 forms another p-n junction 45b together with the n-type well 41, and the p-n junction 45b serves as the diode D2. The p-type well 43 per se serves as the back gate of the n-channel enhancement type field effect transistor MN1. N-type impurity regions 43a/43b are formed in the p-type well 43, and are spaced from each other. A thin gate insulating layer 46b is grown on the p-type well 43 between the n-type impurity regions 43a/43b, and a conductive line 47b extends over the thin gate insulating layer 46b. The n-type impurity regions 43a/44b and a part of the conductive line 47b serve as the source/drain nodes and the gate electrode of the n-channel enhancement type field effect transistor MN1. The n-type impurity region 42b is further connected to the n-type impurity region 43a.

A heavily-doped p-type impurity region 43c is formed in another surface portion of the p-type well 43, and the capacitor C2 is connected to the conductive line 47b, the n-type impurity region 43b and the heavily-doped p-type impurity region 43c. The clock signal FB is supplied to the other electrode of the capacitor C2.

Figure 9:
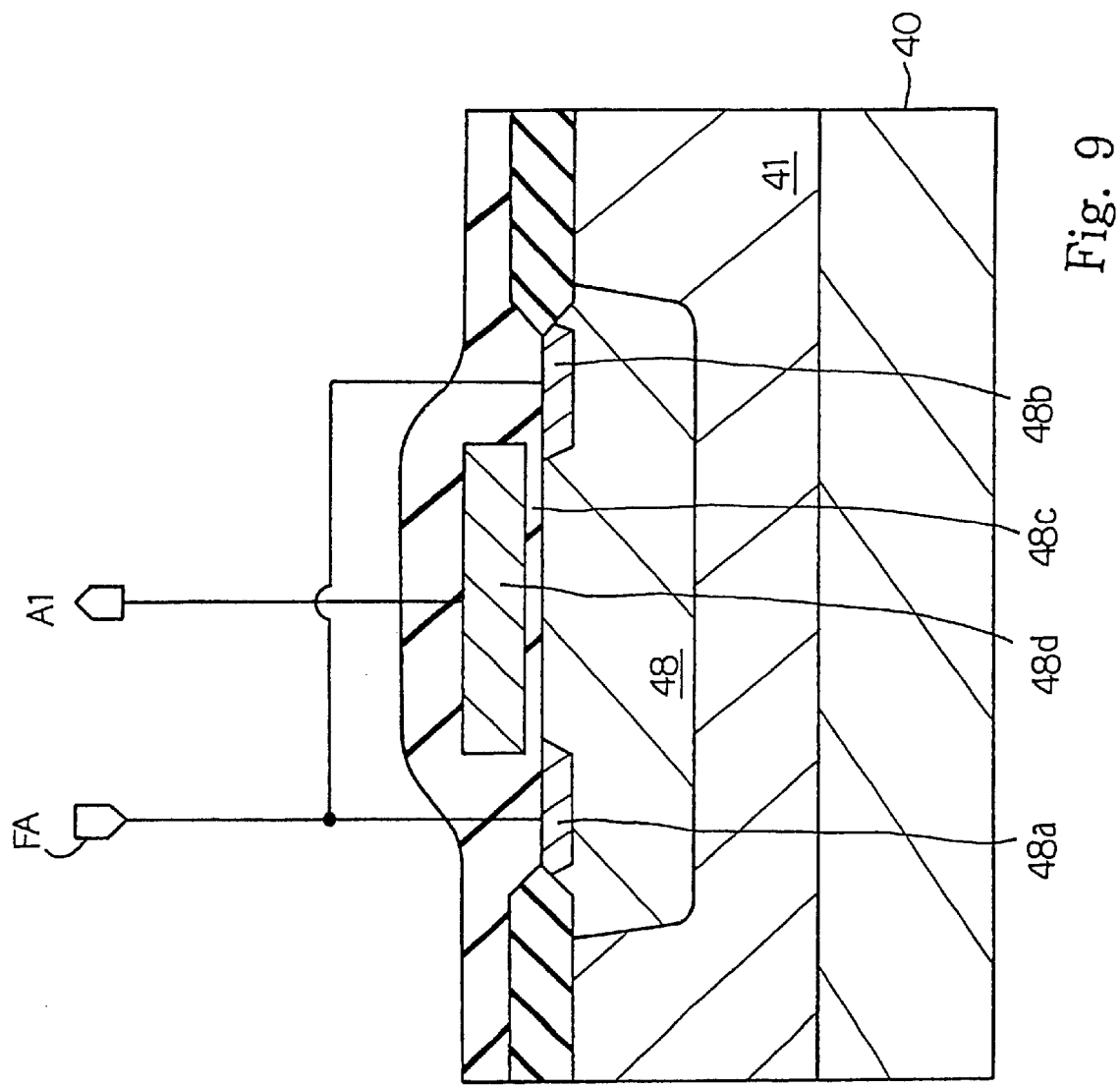
FIG. 9 is a cross sectional view showing a capacitor incorporated in the charge pump circuit according to the present invention.

The capacitors C1/C2/C3 are implemented by p-channel depletion type field effect transistors formed in the n-type well 41, respectively. One of the p-channel depletion type field effect transistors is shown in FIG. 9. A p-type well 48 is formed in another surface portion of the n-type well 41, and heavily-doped p-type impurity regions 48a/48b are spaced from each other in the p-type well 48. A thin gate insulating layer 48c is grown over the p-type well 48 between the heavily-doped p-type impurity regions 48a and 48b, and a gate electrode 48d is laminated on the thin gate insulating layer 48c. The gate electrode 48d is, by way of example, connected to the boosted node A1, and the clock signal FA is supplied to the heavily-doped p-type impurity regions 48a/48b. The gate potential is not consumed in the depletion type field effect transistor for generating an inversion layer, and a large amount of electric charge is accumulated between the depletion channel 48 and the gate electrode 48d.

Figure 10:
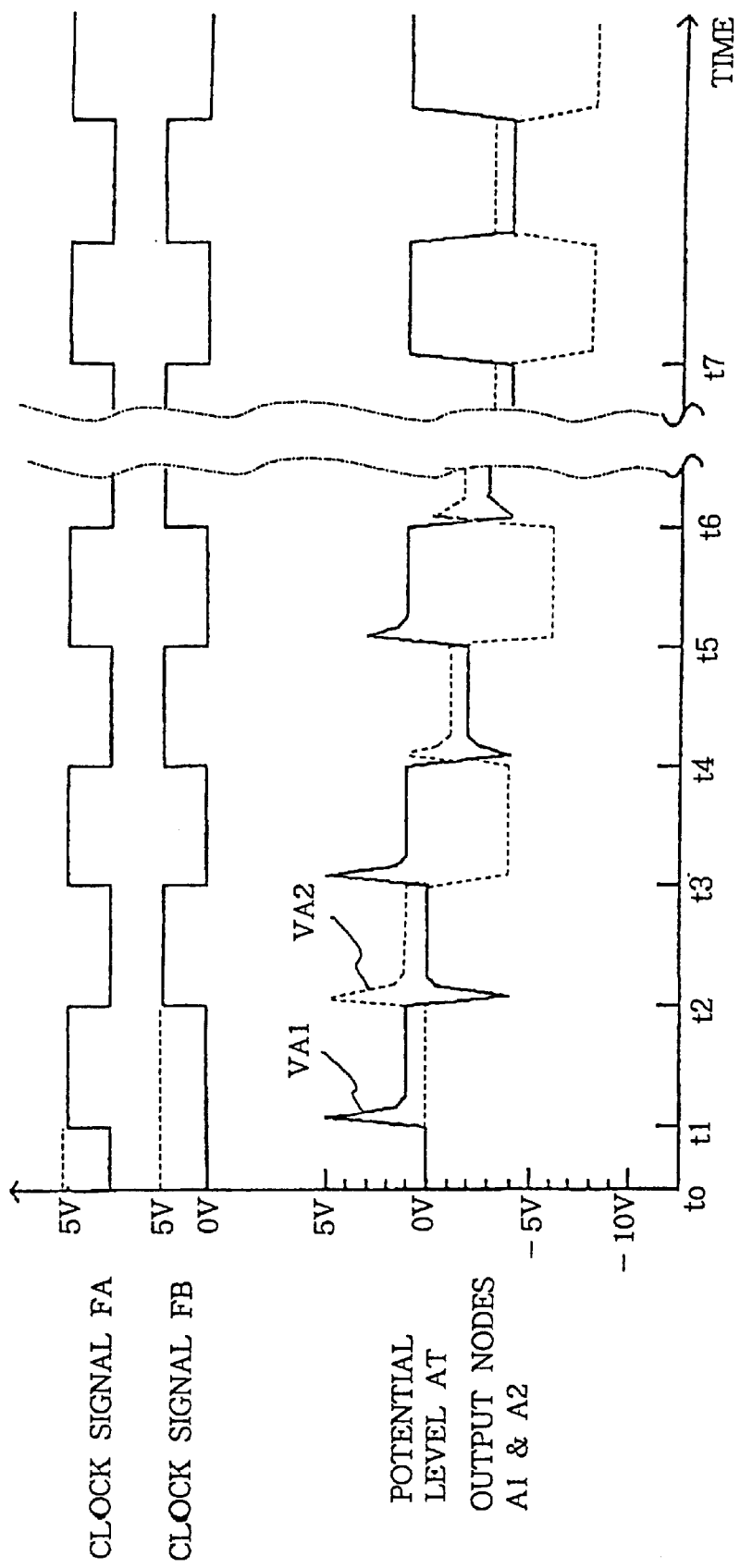
FIG. 10 is a timing chart showing the behavior of the charge pump circuit according to the present invention.

Description is hereinbelow made on the circuit behavior of the charge pump circuit according to the present invention with reference to FIG. 10. Although only the potential levels at the boosted nodes A1/A2 are shown and described, the potential variations at the other boosted node A3 and the output node Vncp are analogous.

The clock signals FA and FB are in the ground level at time t0. The clock signal FA rises at time t1, and the other clock signal FB remains low. The n-channel enhancement type field effect transistor MN1 is turned off, and the potential level at the boosted node A2 is unchanged. On the other hand, the clock signal FA causes the capacitor C1 to boost the potential level at the boosted node A1. The potential level VA1 at the boosted node A1 is given by equation 1.

$$VA1(t1)=0 \text{ volt}+5 \text{ volts} \times C1/(C1+Ca1) \qquad \text{Equation 1}$$

where VA1(t1) is the potential level VA1 at time t1, C1 is the capacitance of the capacitor C1 and Ca1 is the parasitic capacitance coupled to the boosted node A1. For the sake of simplicity, the parasitic capacitance Ca1 is assumed to be zero. Then, the potential level VA1 rises to 5 volts at time t1.

The potential level VA1 is applied not only to the gate electrode 47a and the n-type drain region 42c but also the heavily-doped p-type impurity region 42c. The n-channel enhancement type field effect transistor MN0 turns on, and the p-n junction between the p-type well 42 and the n-type source region 42a is forwardly biased. Electric current flows into the ground line GND through two current paths, i.e., the conductive channel of the n-channel enhancement type field effect transistor MN0 and the forwardly biased p-n junction. The p-type well 42 is higher than the n-type source region 42a, and the back-gate bias is oppositely applied to the n-channel enhancement type field effect transistor MN0. For this reason, the n-channel enhancement type field effect transistor MN0 does not increase the threshold. Moreover, the p-n junction between the p-type well 42 and the n-type source region 42a is free from the back-gate biasing effect, and the potential level in the p-type well and, accordingly, the potential level at the boosted node A1 is decreased toward the forward bias voltage at the p-n junction. The forward bias voltage and the threshold of the n-channel enhancement type field effect transistor MN0 are assumed to be 1 volt. The potential level at the boosted node A1 is decreased from the 5 volts to 1 volt.

The clock signal FA is changed from 5 volts to zero volt at time t2, and the clock signal FB is concurrently changed from zero to 5 volts. The capacitor C1 depresses the potential level at the boosted node A1, and the potential level VA1 at time t2 is expressed as $$VA1(t2)=1 \text{ volt} \times 5 \text{ volts} \times C1/(C1+Ca1)=-4 \text{ volts} \qquad \text{Equation 2}$$

where VA1(t2) is the potential level VA1 at time t2. The potential level VA2 at time t2 is given by equation 3.

$$VA2(t2)=0 \text{ volt}+5 \text{ volts} \times C2/(C2+Ca2)=5 \text{ volts} \qquad \text{Equation 3}$$

where VA2(t2) is the potential level VA2 at the boosted node A2 at time t2, C2 is the capacitance of the capacitor C2 and Ca2 is the parasitic capacitance coupled to the boosted node A2. In this instance, the parasitic capacitance Ca2 is assumed to be zero for the sake of simplicity.

The potential level VA2(t2) is applied to the gate electrode 47b, the n-type drain region 43b and the p-type well 43 through the heavily-doped p-type impurity region 43c. The n-channel enhancement type field effect transistor MN1 turns on, and the p-n junction between the p-type well 43 and the n-type source region 43a is forwardly biased. Electric current flows from the boosted node A2 to the boosted node A1 through the n-channel enhancement type field effect transistor MN1 and the forwardly biased p-n junction. As a result, the boosted node A2 is decreased from 5 volts to 1 volt, and the boosted node A1 rises from −4 volts to zero volt.

The clock signal FA rises from zero to 5 volts at time t3, and the other clock signal FB is decayed from 5 volts to zero. The potential levels VA1/VA2 at time t3 are given as $$VA1(t3)=0 \text{ volt}+5 \text{ volts} \times C1/(C1+Ca1)=5 \text{ volts} \qquad \text{Equation 4}$$

where VA1(t3) is the potential level VA1 at time t3.

$$VA2(t3)=1 \text{ volt}-5 \text{ volts} \times C2/(C2+Ca2)=-4 \text{ volts} \qquad \text{Equation 5}$$

where VA2(t3) is the potential level VA2 at the boosted node A2 at time t3.

Electric current flows from the boosted node A1 to the ground line GND through the n-channel enhancement type field effect transistor MN0 and the forwardly biased p-n junction as similar to the electric current at time t1. The boosted node A1 is decayed to 1 volt, and the boosted node A2 is maintained at −4 volts.

The clock signal FA falls from 5 volts to zero at time t4, and the other clock signal FB concurrently rises from zero to 5 volts. The potential levels VA1/VA2 at time t4 are given as $$VA1(t4)=1 \text{ volt}-5 \text{ volts} \times C1/(C1+Ca1)=-4 \text{ volts} \qquad \text{Equation 6}$$

where VA1(t4) is the potential level VA1 at time t4.

$$VA2(t4)=-4 \text{ volts}+5 \text{ volts} \times C2/(C2+Ca2)=1 \text{ volts} \qquad \text{Equation 7}$$

where VA2(t4) is the potential level VA2 at time t4. Electric current flows from the boosted node A2 to the boosted node A1 as similar to the electric current at time t2. The boosted node A2 is decayed from 1 volt to −1 volt, and the boosted node A1 rises from −4 volts to −2 volts.

After time t4, the potential level VA2 is stepwise changed in the negative direction. The potential levels VA1 are respectively changed between 1 volt and −4 volts and between −3 volts and −8 volts after time t7 in synchronization with the clock signals FA/FB. Even if the charge pump circuit only has the input diode circuit 31 and the single boosting stage 32, the charge pump circuit generates the negative potential level of −8 volts. The charge pump circuit with the three boosting stages 32/33/34 can generate a negative voltage lower than −8 volts at the output node Vncp.

As will be understood from the foregoing, description, the charge pump circuit according to the present invention is free from the decrease of the threshold due to the backgate biasing effect, and achieves a large boosting efficiency.

Figure 11:
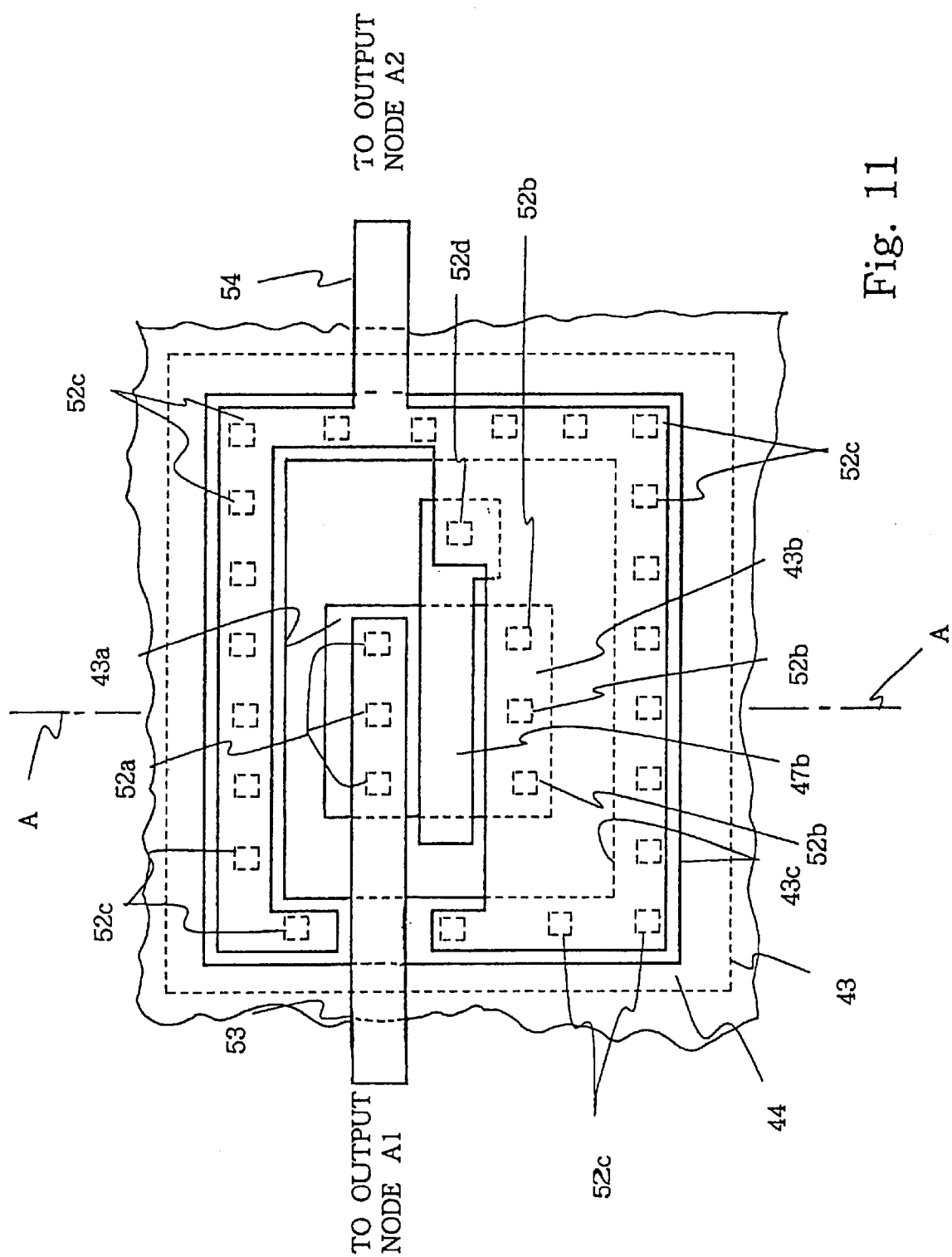
FIG. 11 is a plane view showing another layout of a boosting stage incorporated in the charge pump circuit.
Figure 12:
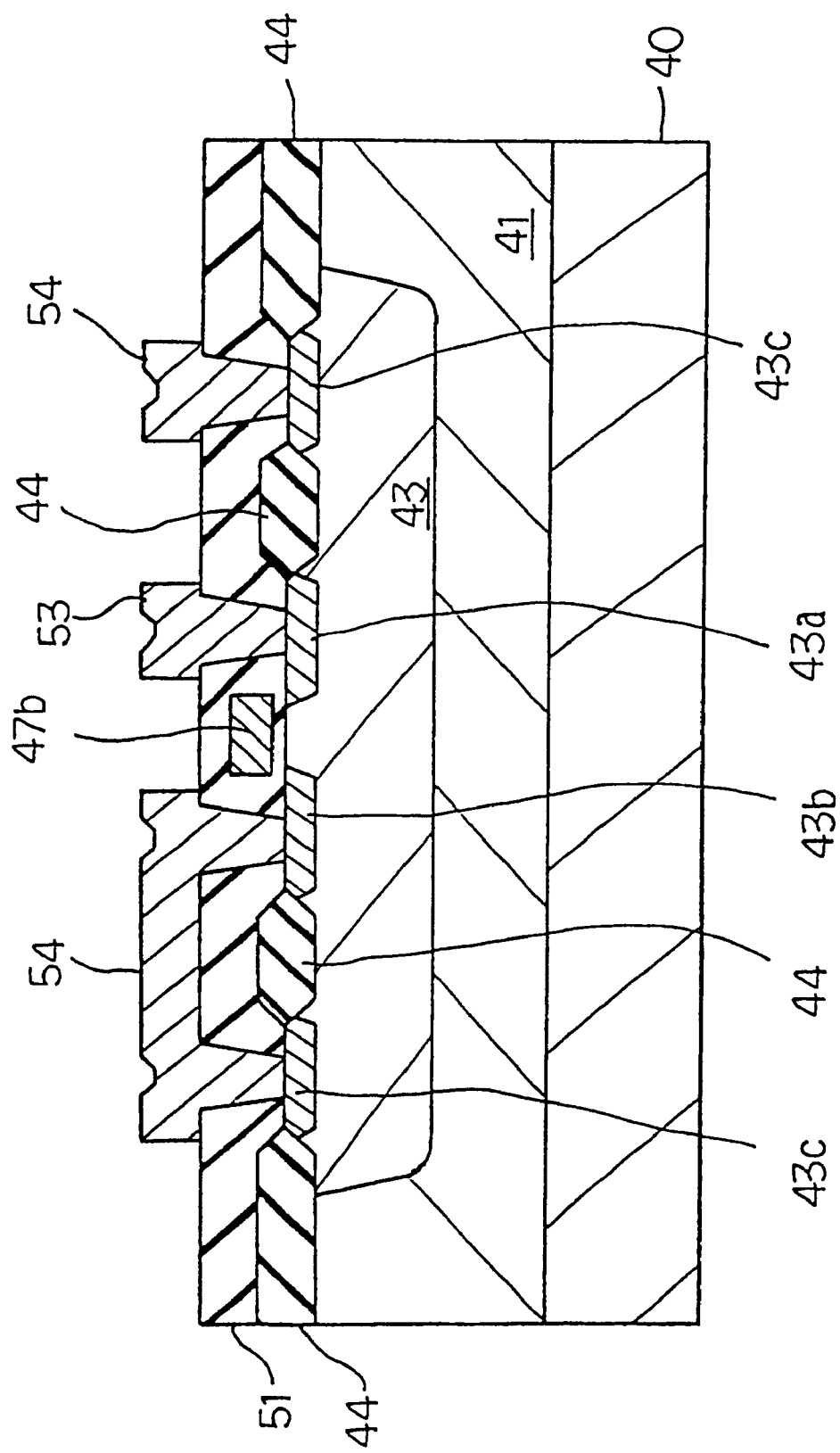
FIG. 12 is a cross sectional view taken along line A—A of FIG. 1 and showing the structure of the boosting stage.

Various semiconductor structures for the charge pump circuit MN1 are employable. FIG. 11 illustrates a layout for the boosting stage 32, and FIG. 12 shows a cross section taken along line A—A. Impurity regions and conductive lines of the boosting stage 32 are labeled with the same references designating corresponding impurity regions and the conductive lines used in FIG. 8. Although the impurity regions and a conductive line are covered with an inter-level insulating layer 51 (see FIG. 12), the inter-level insulating layer 51 is remove from the layout shown in FIG. 11 so that the layout is clearly seen.

The p-type well 43 occupies a rectangular area in the n-type well 41, and the n-type impurity regions 43a/43b are assigned a square area in the rectangular area. The heavily-doped p-type region 43c is assigned a frame-like area along the periphery of the rectangular area assigned to the p-type well 41, and the periphery of the rectangular area is under the thick field oxide layer 44. The thick field oxide layer 44 is grown between the frame-like area and the square area, and offers the electrical isolation between the n-type impurity regions 43a/43c and the heavily-doped p-type impurity region 43c.

The gate electrode 47b is located over the channel region between the n-type impurity regions 43a and 43b, and the gate electrode 47b is covered with the inter-level insulating layer 51. Contact holes 52a/52b/52c are formed in the inter-level insulating layer 51, and the n-type impurity region 43a, the n-type impurity region 43b and the heavily-doped p-type region 43c are exposed to the contact holes 52a, 52b and 52c, respectively. Although only eight contact holes for the heavily-doped p-type impurity region 43c are labeled with 52c, the contact holes 52c are formed along the frame-like area.

A conductive layer 53 extends on the inter-level insulating layer 51, and is held in contact with the n-type impurity region 43 through the contact holes 52a. The conductive layer 53 is connected to the boosted node A1 at the other end thereof. The boosted node A2 is connected to a conductive layer 54, which is bifurcated so as to extend along the frame-like heavily-doped p-type region 43c. The conductive layer 54 is held in contact with the n-type impurity region 43b through the contact holes 52b and with the heavily-doped p-type impurity region 43c through the contact holes 52c. Another contact hole 52d is further formed in the inter-level insulating layer 51, and offers an electrical connection between the conductive layer 54 and the gate electrode 47b.

The square area assigned to the n-type source region 43a is surrounded by the frame-like heavily doped p-type impurity region 43c. This feature is desirable for the current path through the p-n junction between the p-type well 43c and the heavily-doped impurity re-ion 43a, because the current path is so wide that the resistance is quite low. As a result, the potential level VA2 is rapidly decayed.

Figure 13:
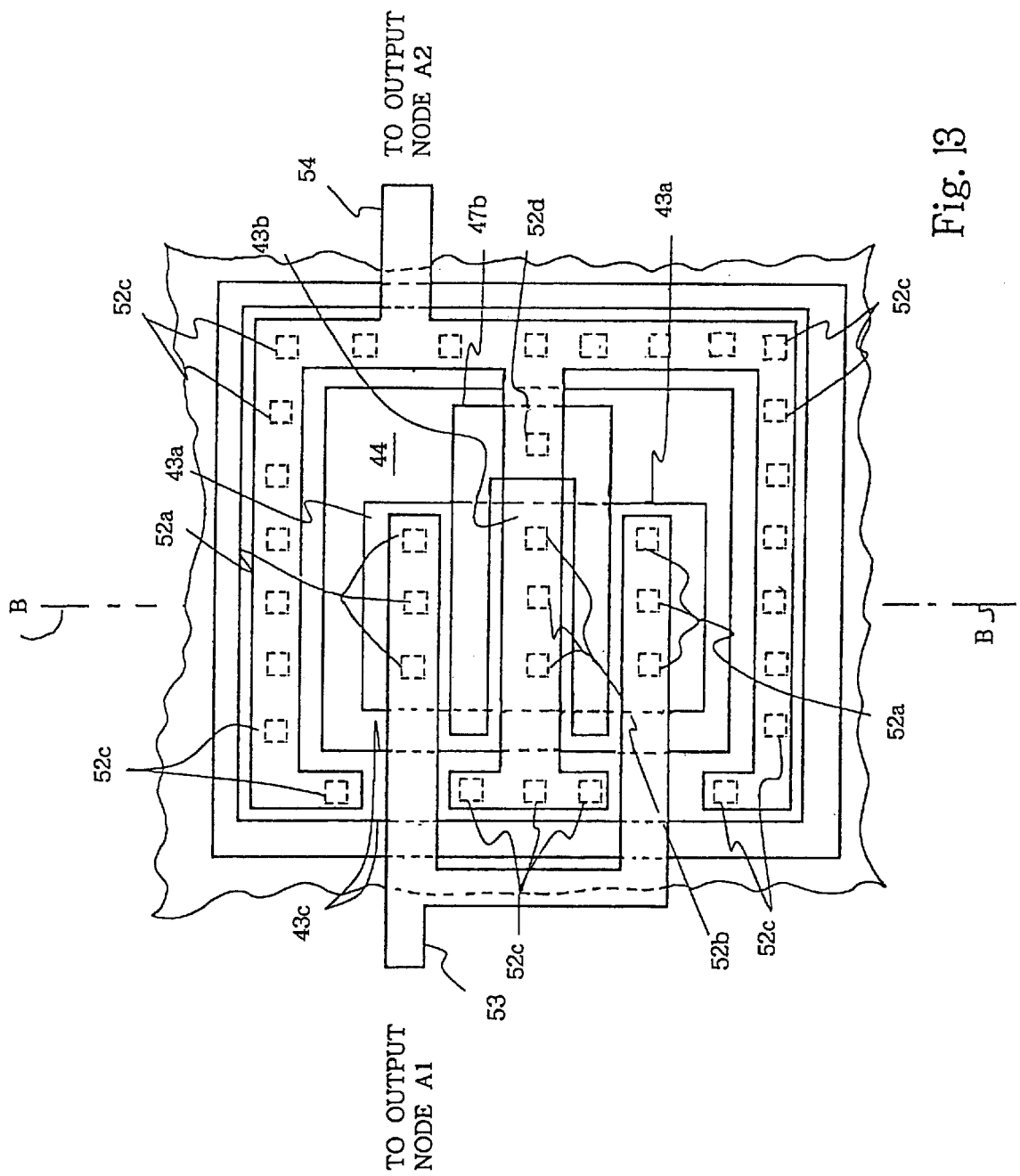
FIG. 13 is a plane view showing yet another layout of the boosting stage incorporated in the charge pump circuit.
Figure 14:
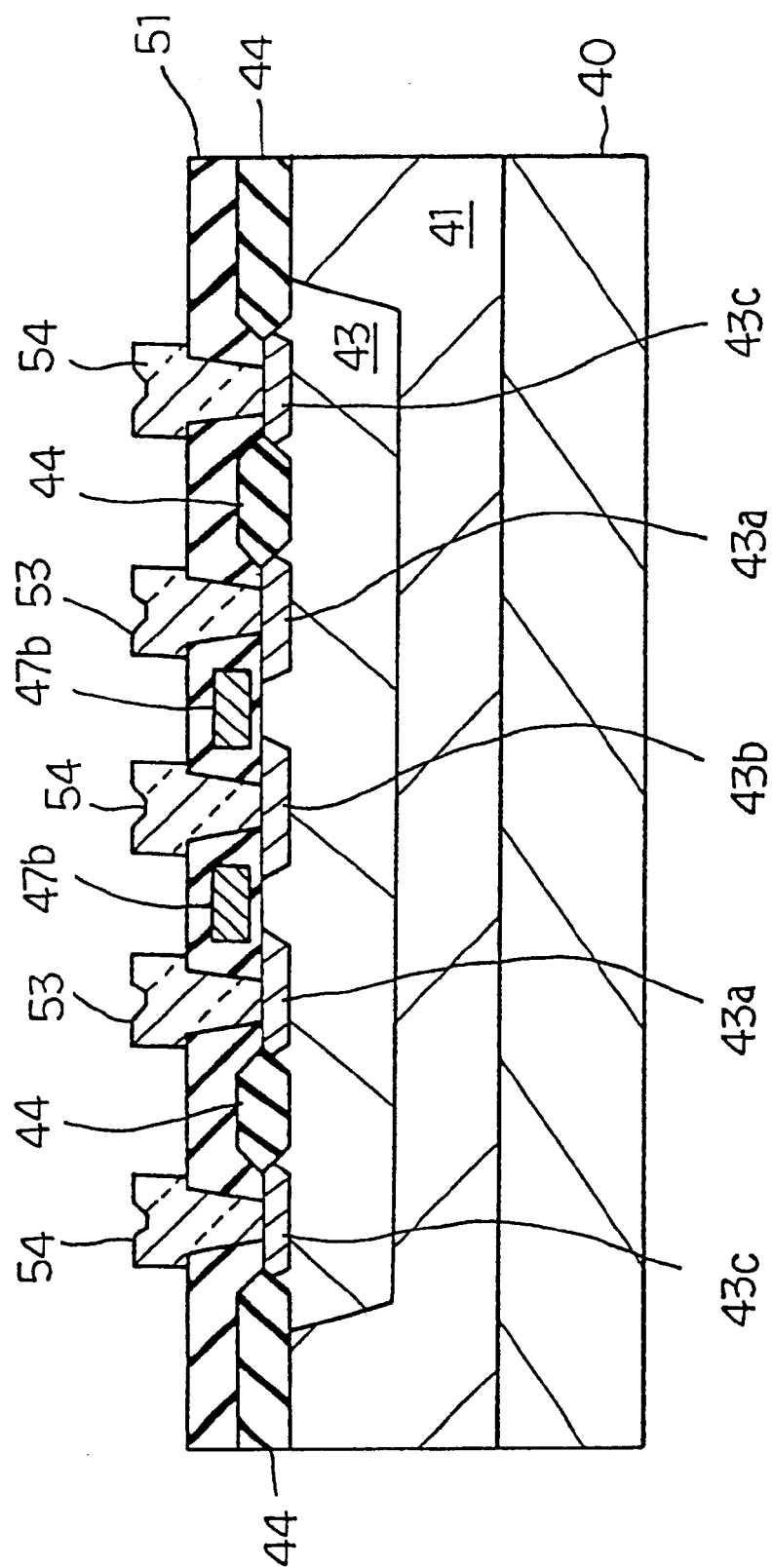
FIG. 14 is a cross sectional view taken along line B—B of FIG. 13 and showing the structure of the boosting stage.
Figure 15:
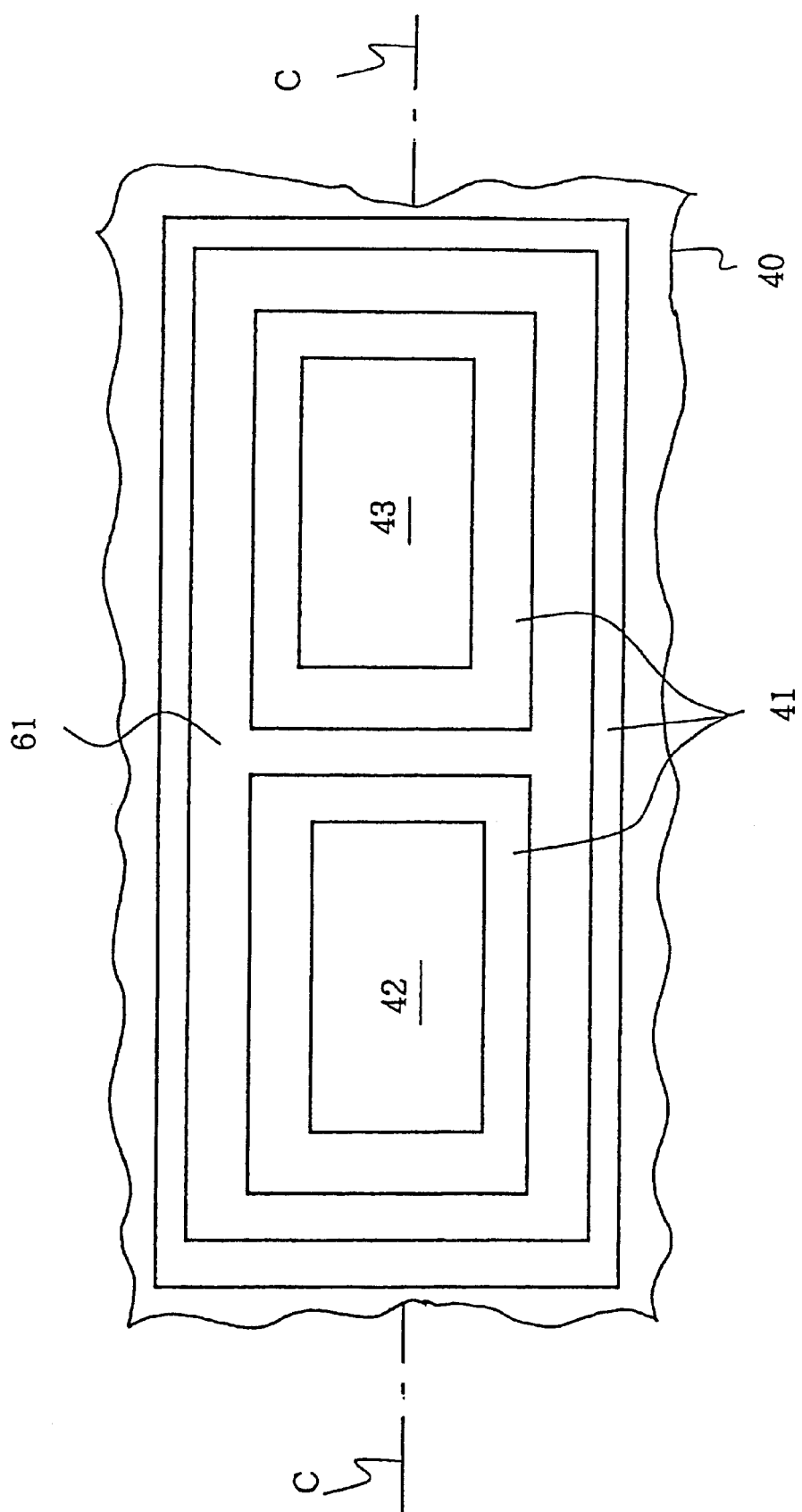
FIG. 15 is a plane view showing a layout in an n-type well.
Figure 16:
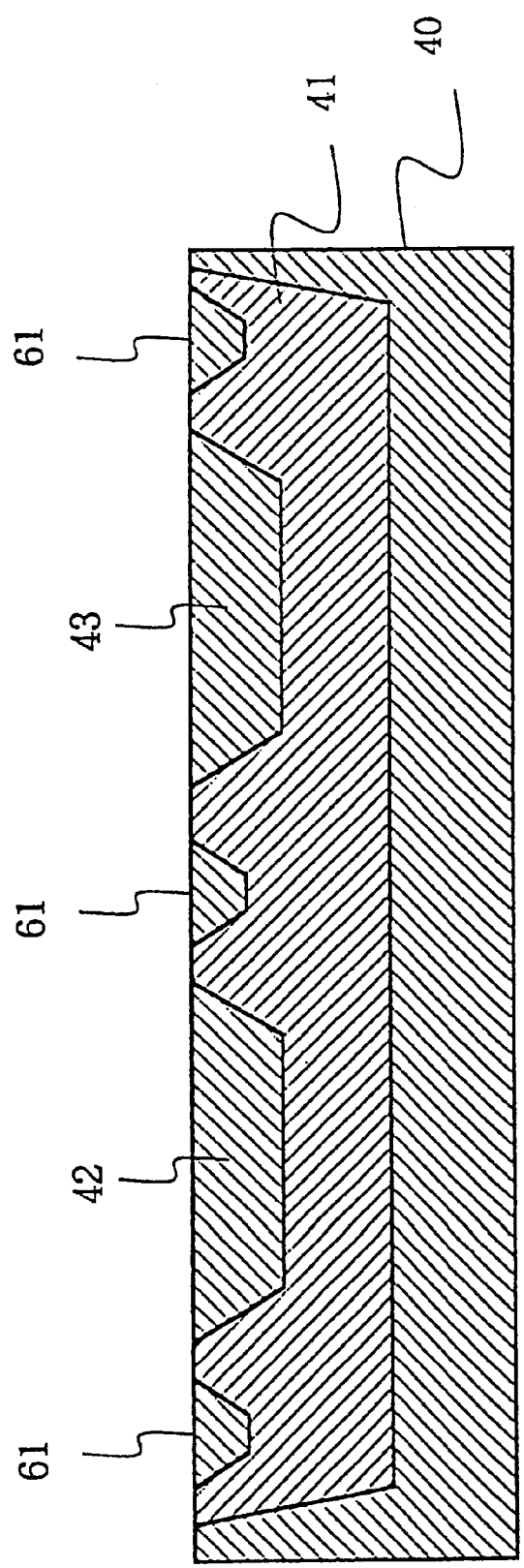
FIG. 16 is a cross sectional view taken along line C—C of FIG. 15 and showing the semiconductor structure in the n-type well.

Another alternative layout is shown in FIGS. 13 and 14. The boosting stage 32 shown in FIG. 13 is different from that shown in FIG. 11 in the layout of the n-channel enhancement type field effect transistor MN1. The n-channel enhancement type field effect transistor MN1 has two n-type impurity regions 43a spaced from the n-type impurity region 43b, and, accordingly, the gate electrode 47b is bifurcated so as to extend over two channel regions between the n-type impurity regions 43a and the n-type impurity region 43b. Impurity regions, conductive layers and contact holes shown in FIGS. 13 and 14 are labeled with the same references designating corresponding components of the boosting stage 32 shown in FIG. 11 and 12 without detailed description. The two n-type impurity regions 43a widen the current path from the heavily-doped p-type impurity region 43c, and the resistance is further decreased. As a result, the potential level VA2 is decayed much faster than the potential level VA2 of the charge pump circuit shown in FIG. 8.

As described hereinbefore, the p-type wells 42/43 are formed in the n-type well 41 at intervals. An n-type channel stopper 61 may be formed between the p-type w ell s 42/43a and the periphery of the n-type well 41. The n-channel enhancement type field effect transistor MN0/MN1 and the heavily-doped p-type impurity regions 42c/43c are arranged in the p-type well 42/43 as shown in FIG. 8, 11/12 or 14. The n-type channel stopper 61 is biased at the same voltage as the n-type well 41. In this instance, the bias voltage is equal to the positive power voltage Vcc. The n-type channel stopper 61 is effective against surface leakage current between the p-type wells 42/43 and the p-type semiconductor substrate 40.

Second Embodiment

Figure 17:
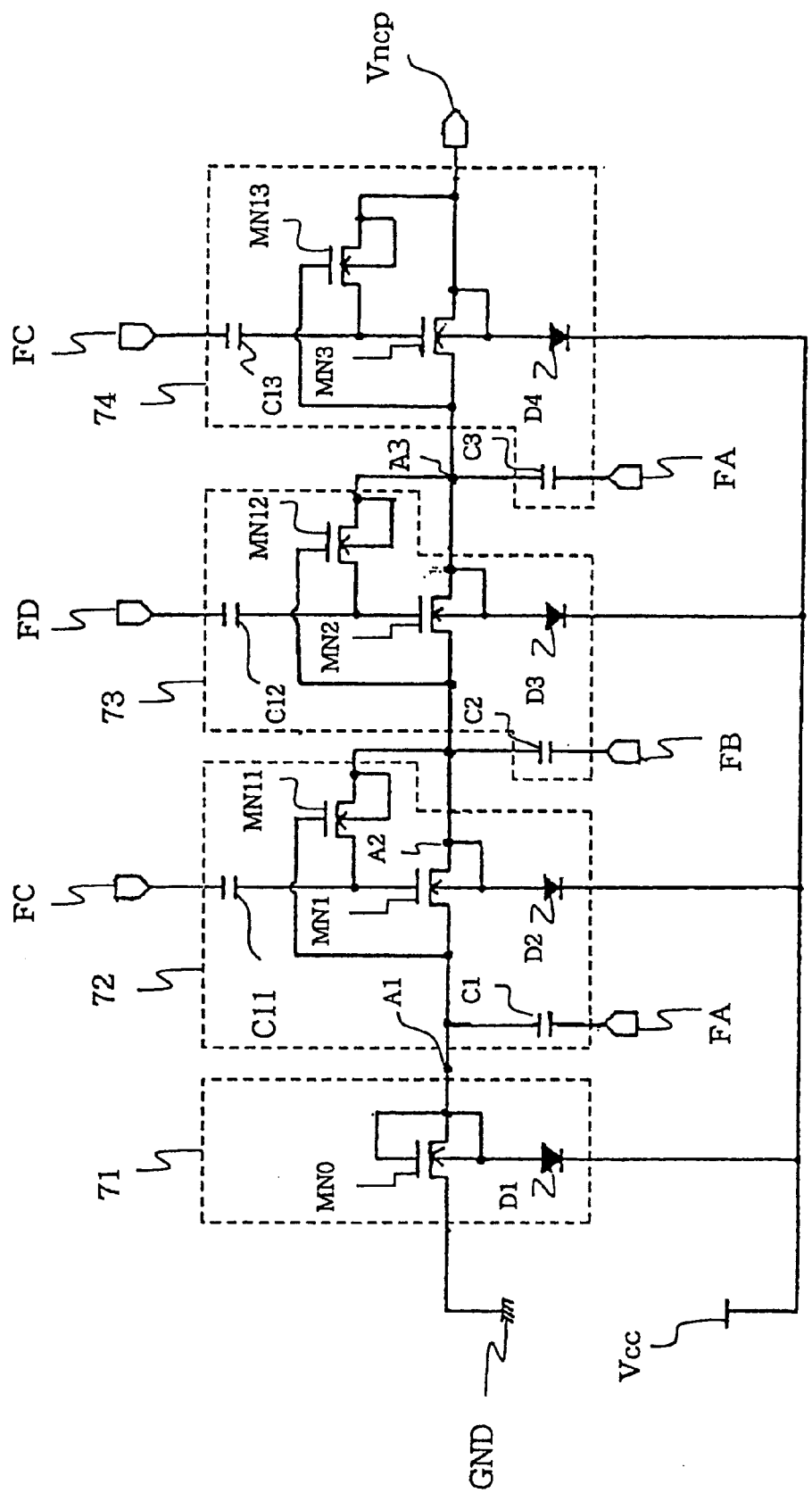
FIG. 17 is a circuit diagram showing the circuit configuration of another charge pump circuit according to the present invention.

Turning to FIG. 17, another charge pump circuit embodying the present invention largely comprises an input diode circuit 71 and boosting stages 72/73/74 connected in series between a ground line GND and an output node Vncp. A boosted node A1 is between the input diode circuit 71 and the first boosting stage 72, and boosted nodes A2/A3 are provided between the boosting stages 72, 73 and 74.

The input diode circuit 71 is similar in circuit configuration to the input diode circuit 31, and the circuit components of the input diode circuit 71 are labeled with the same references designating corresponding circuit components of the input diode circuit 31 without detailed description.

The boosting stages 72/73/74 are similar in circuit configuration to one another. Each of the boosting stages 72/73/74 includes an n-channel enhancement type field effect transistor MN1/MN2/MN3 connected between the associated nodes A1/A2/A3 and A2/A3/Vncp, a capacitor C1/C2/C3 connected to the boosted node A1/A2/A3 and a diode D2/D3/D4 connected between the back gate of the n-channel enhancement type field effect transistor MN1/MN2/MN3 and a positive power supply line Vcc. These circuit components are similar to those of the first embodiment, and no further description is incorporated hereinbelow.

Figure 5:
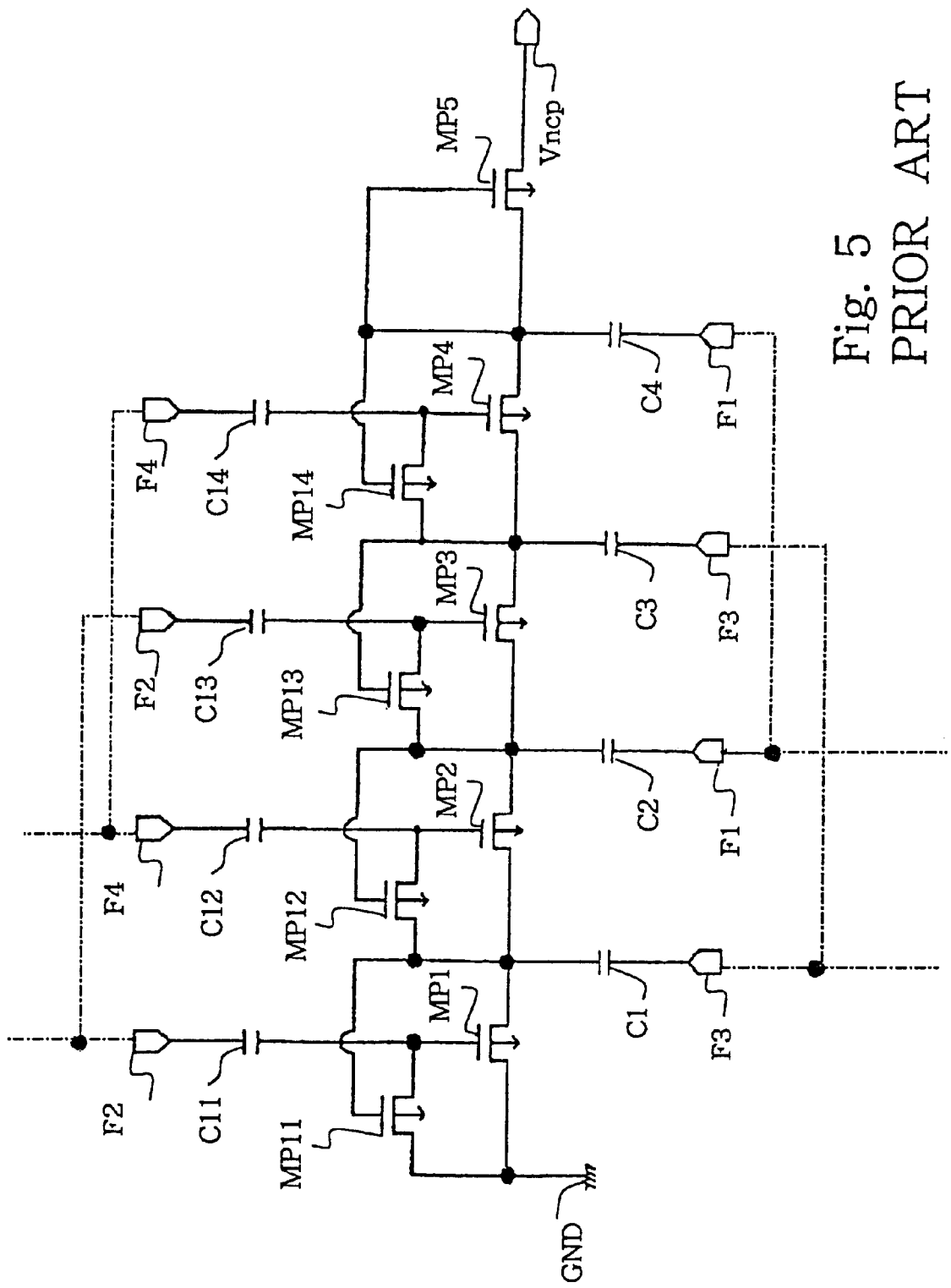
FIG. 5 is a circuit diagram showing the circuit configuration of the prior art charge pump circuit disclosed in IEEE Journal of Solid-State Circuit.
Figure 6:
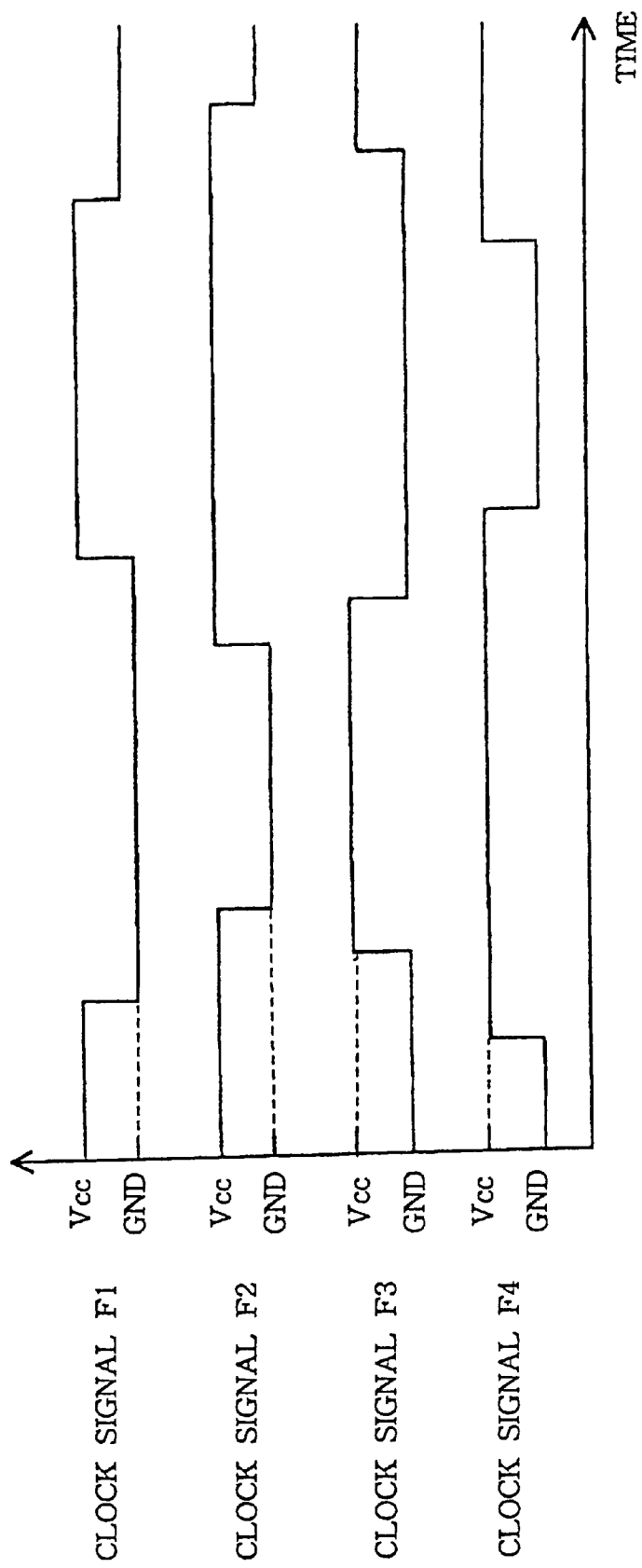
FIG. 6 is a timing chart showing the circuit behavior of the prior art charge pump circuit.
Figure 18:
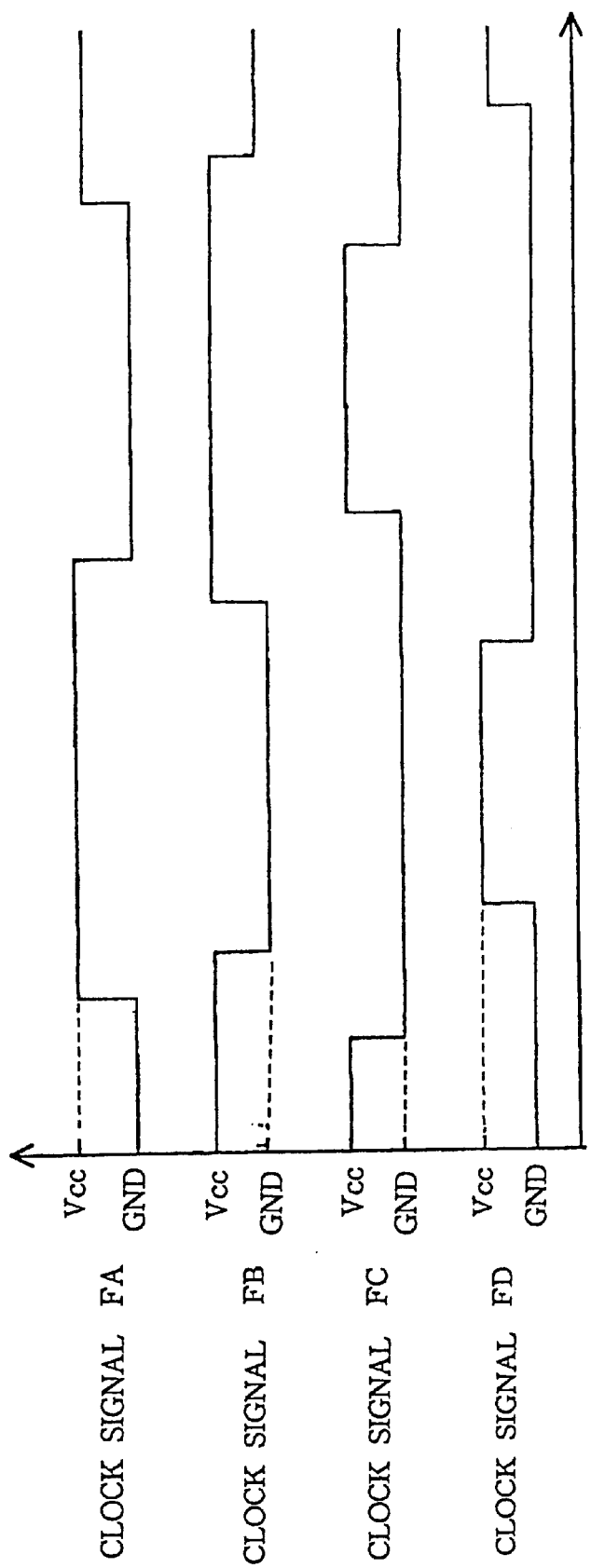
FIG. 18 is a timing chart showing the behavior of the charge pump circuit.

The boosting stage 72/73/74 further includes an n-channel enhancement type field effect transistor MN11/MN12/MN13 connected between the node A2/A3/Vncp and the gate electrode of the n-channel enhancement type field effect transistor MN1/MN2/MN3 and a capacitor C11/C12/C13 connected to the gate electrode of the n-channel enhancement type field effect transistor MN1/MN2/MN3. The boosted node A1/A2/A3 is connected to the gate electrode of the n-channel enhancement type field effect transistor MN11/MN12/MN13, and clock signals FC and FPD are supplied to the capacitors C11/C13 and the capacitor C12. The clock signals FA/FB/FC/FD are periodically changed as shown in FIG. 18, and the n-channel enhancement type field effect transistors MN11/MN12/MN13 and the capacitors C11/C12/C13 behave as similar to the p-channel enhancement type field effect transistors MP11–MP14 and the capacitors C11–C14 of the prior art charge pump circuit shown in FIG. 5. The n-channel enhancement type field effect transistors MN11/MN12/MN13 keep the gate electrodes of the associated n-channel enhancement type field effect transistors MN1/MN2/MN3 higher than the source/drain nodes thereof so as to improve the current driving capability of the boosting stages 72/73/74.

The structure and the layout described in connection with the first embodiment are available for the charge pump circuit shown in FIG. 17.

The input diode circuit 71 and the boosting stages 72/73/74 provide two current paths, i.e., the conductive channel of the n-channel enhancement type field effect transistors MN0/MN1/MN2/MN3 and the p-n junctions between the p-type wells and the n-type source regions, and improve the boosting efficiency of the charge pump circuit. The charge pump circuit implementing the second embodiment is larger in current driving capability than the charge pump circuit implementing the first embodiment by virtue of the additional circuit components MN11–MN13 and C11–C13.

Third Embodiment

Figure 19:
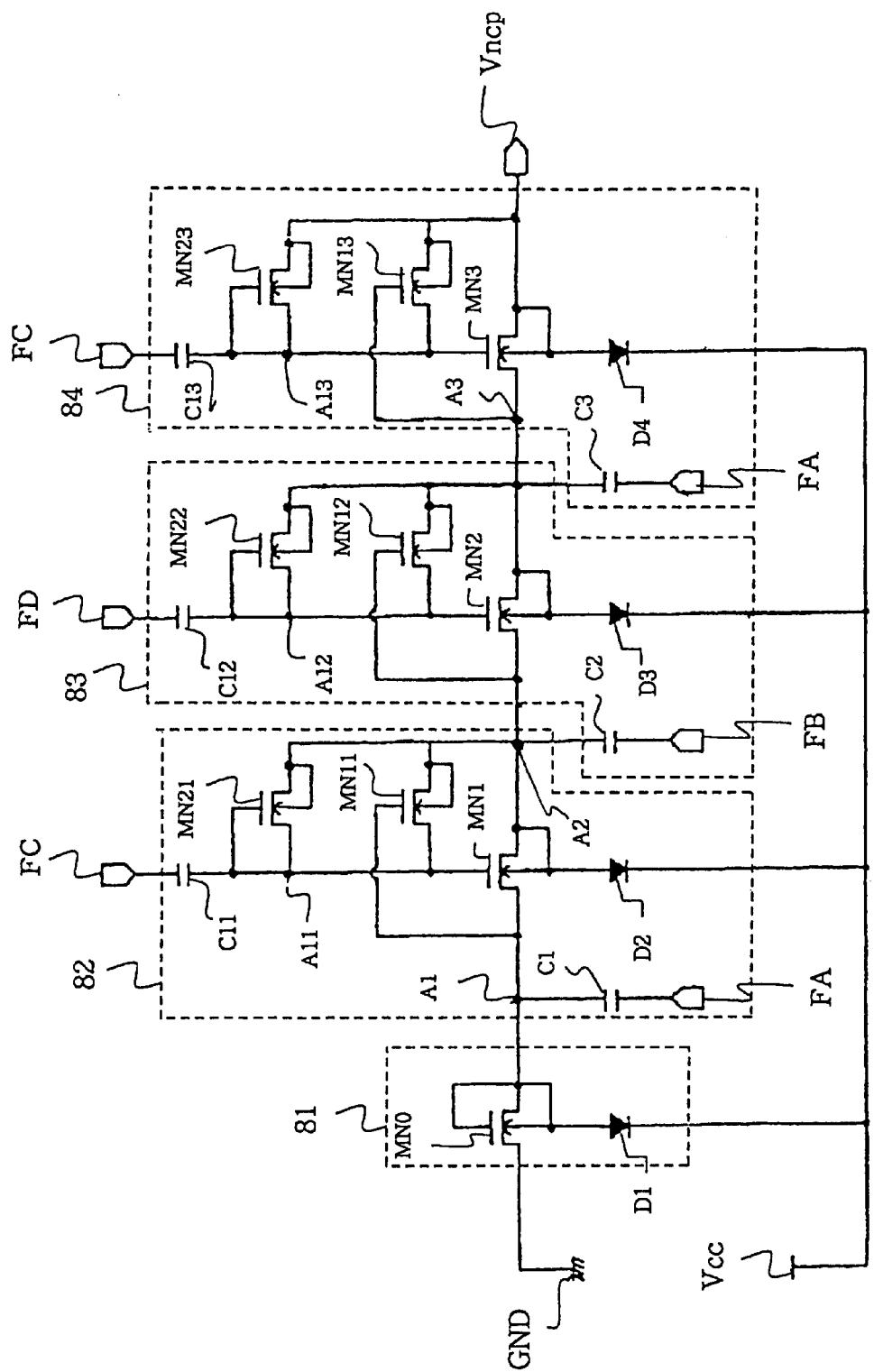
FIG. 19 is a circuit diagram showing the circuit configuration of yet another charge pump circuit according to the present invention.

FIG. 19 illustrates yet another charge pump circuit embodying the present invention. The charge pump circuit implementing the third embodiment largely comprises an input diode circuit 81 and boosting stages 82/83/84 connected in series between a ground line GND and an output node Vncp. The input diode circuit 81 is similar in circuit configuration to the input diode circuit 31, and circuit components of the input diode circuit 81 are labeled with references designating corresponding circuit components of the input diode circuit 31 without detailed description.

The boosting stages 82/83/84 are similar in circuit configuration to the boosting stages 71/72/73 except n-channel enhancement type field effect transistors MN21/MN22/MN23. For this reason, other circuit components are labeled with the same references designating corresponding circuit components of the boosting stages 72/73/74 without detailed description.

The n-channel enhancement type field effect transistors MN21/MN22/MN23 make the behavior of the n-channel enhancement type field effect transistors MN11/MN12/MN13 sure. Assuming now that the boosting stage 82 is to discharge the electric charge from the boosted node A2 to the boosted node A1, the block signals FA, FB and FC are changed to the low level, the high level and the high level, respectively. The n-channel enhancement type field effect transistor MN1 turns on, and the electric charge flows from the boosted node A2 to the boosted node A1. Subsequently, the clock signal FC is changed to the low level, and the capacitor C11 pulls down the potential level at the node A11. The clock signal FA is maintained at the high level, and the clock signal FB is chanced to the low level. Then, the n-channel enhancement type field effect transistor MN11 causes the potential level at the node A11 to be pulled down to the potential level at the boosted node A2. The n-channel enhancement type field effect transistor MN1 turns off so as to block reverse current. However, if the potential level at the boosted node A1 is low, the potential level at the node A11 does not reach the target level. In this situation, the reverse current undesirably flows through the n-channel enhancement type field effect transistor MN1. The n-channel enhancement type field effect transistors MN21/MN22/MN23 sufficiently pull down the potential levels at the nodes A11/A12/A13, and cause the n-channel enhancement type field effect transistors MN1/MN2/MN3 to completely turn on regardless of the potential levels at the boosted nodes A1/A2/A3. In other words, the reverse current does not flow.

As will be appreciated from the foregoing description, the n-channel enhancement type field effect transistors MN0 to MN3 have respective back-gates isolated from one another, and the drain nodes bias the back-gates in such a manner as to restrict the back-gate biasing effect. For this reason, the boosted nodes A1/A2/A3 and the output node Vncp are sufficiently pulled down, and the charge pump circuit according to the present invention achieves a high boosting efficiency.

Although particular embodiments of the present invention have been shown and described, it will be apparent to those skilled in the art that various changes and modifications may be made without departing from the spirit and scope of the present invention.

Figure 1:
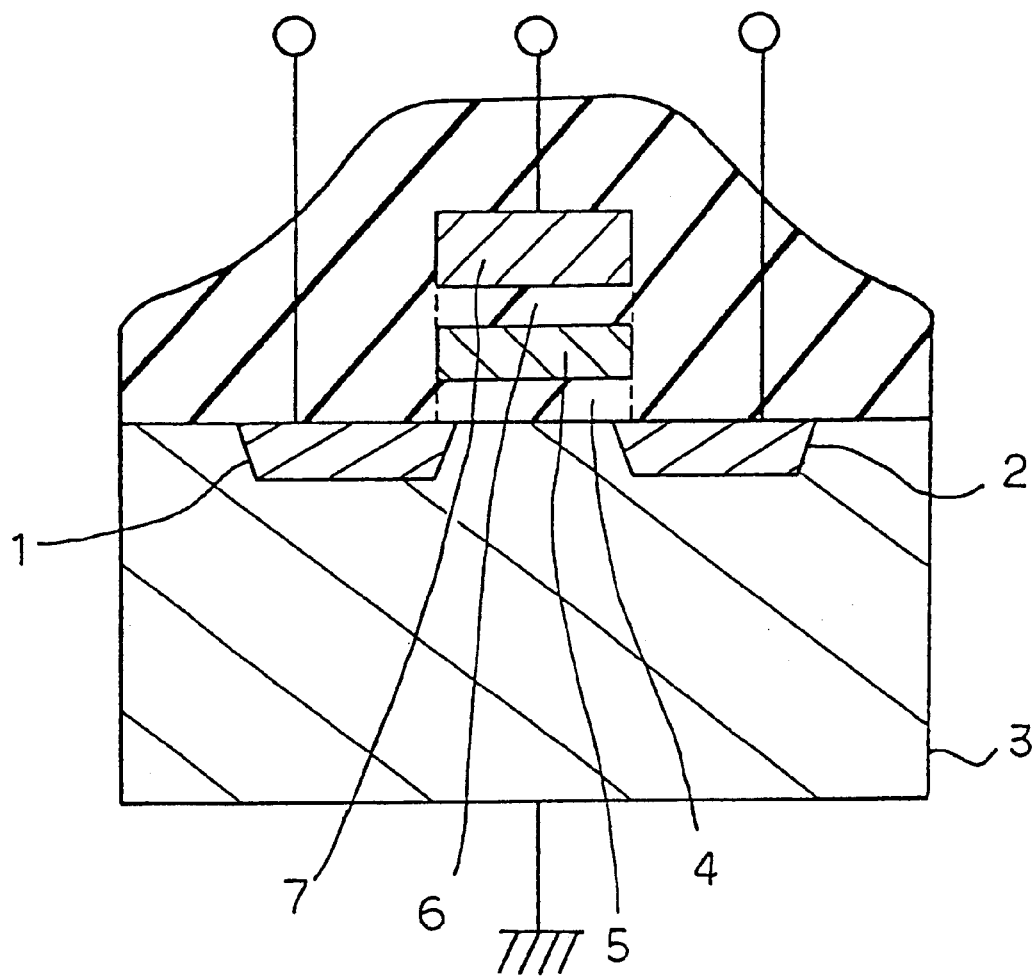
FIG. 1 is a cross sectional schematic view showing the structure of the non-volatile memory cell incorporated in the prior art flash EEPROM device.
Figure 2:
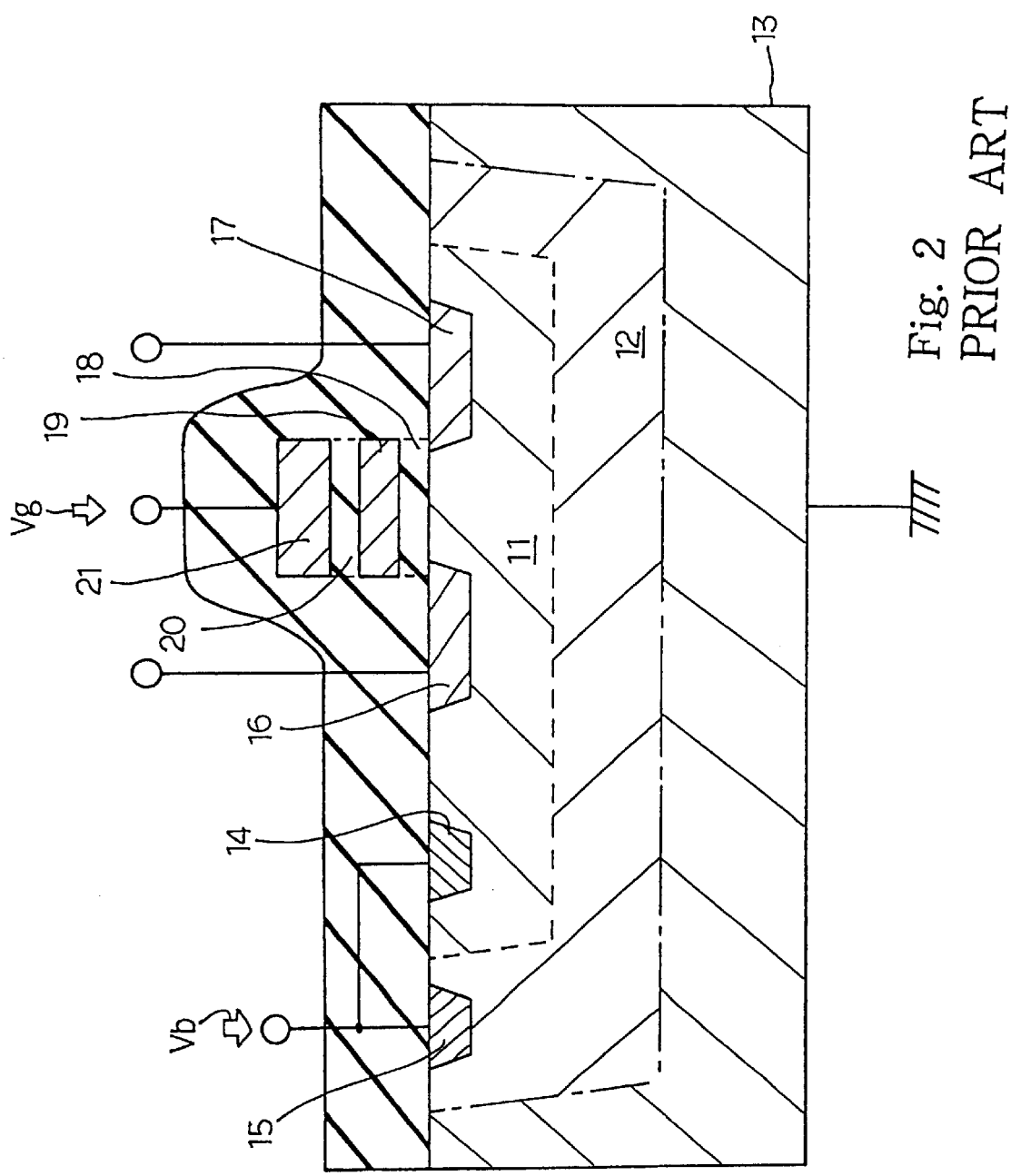
FIG. 2 is a cross sectional schematic view showing the structure of another prior art non-volatile memory cell.
Figure 3:
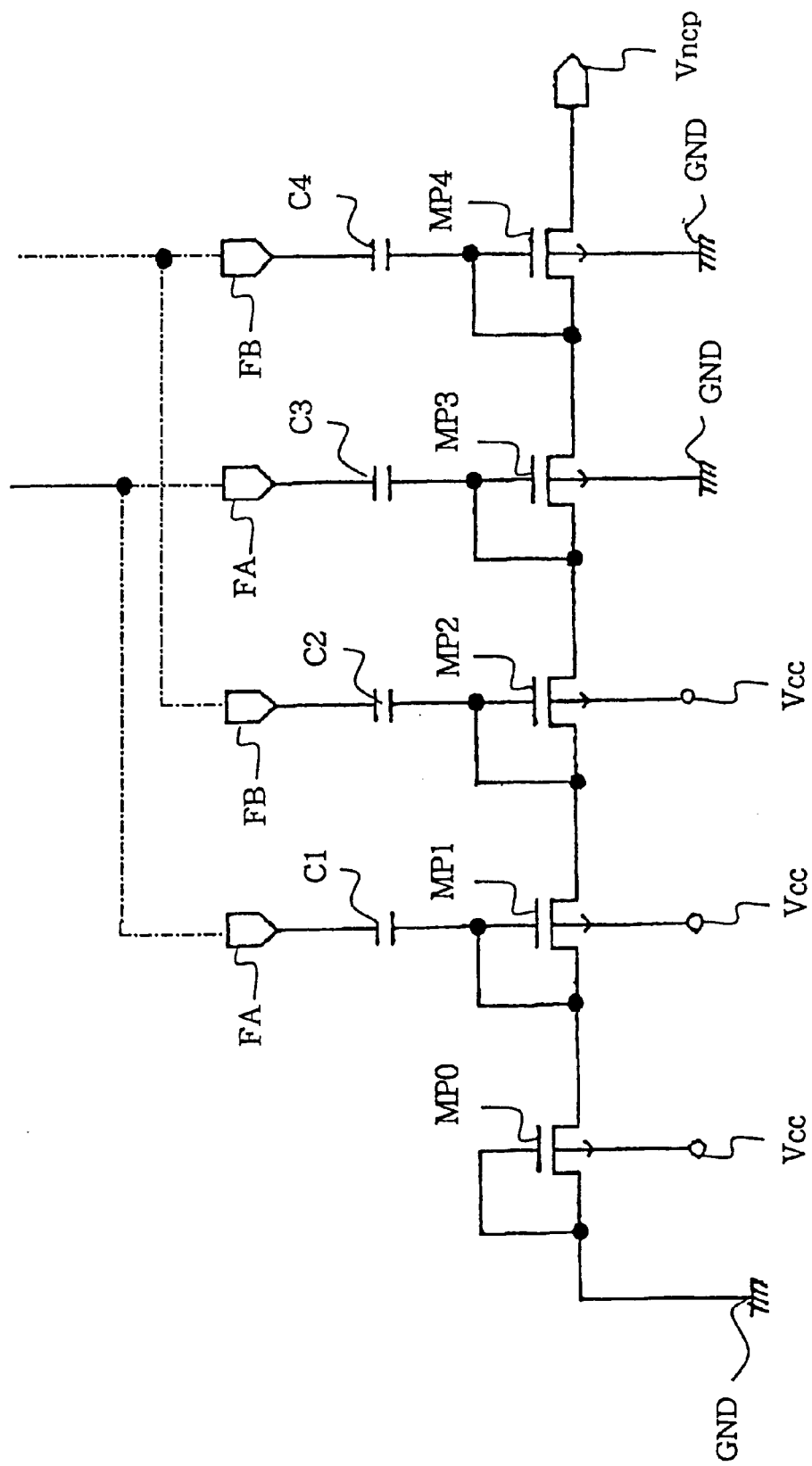
FIG. 3 is a circuit diagram showing the circuit configuration of the prior art charge pump circuit disclosed in Japanese Patent Publication of Unexamined Application No. 8-103070.
Figure 4:
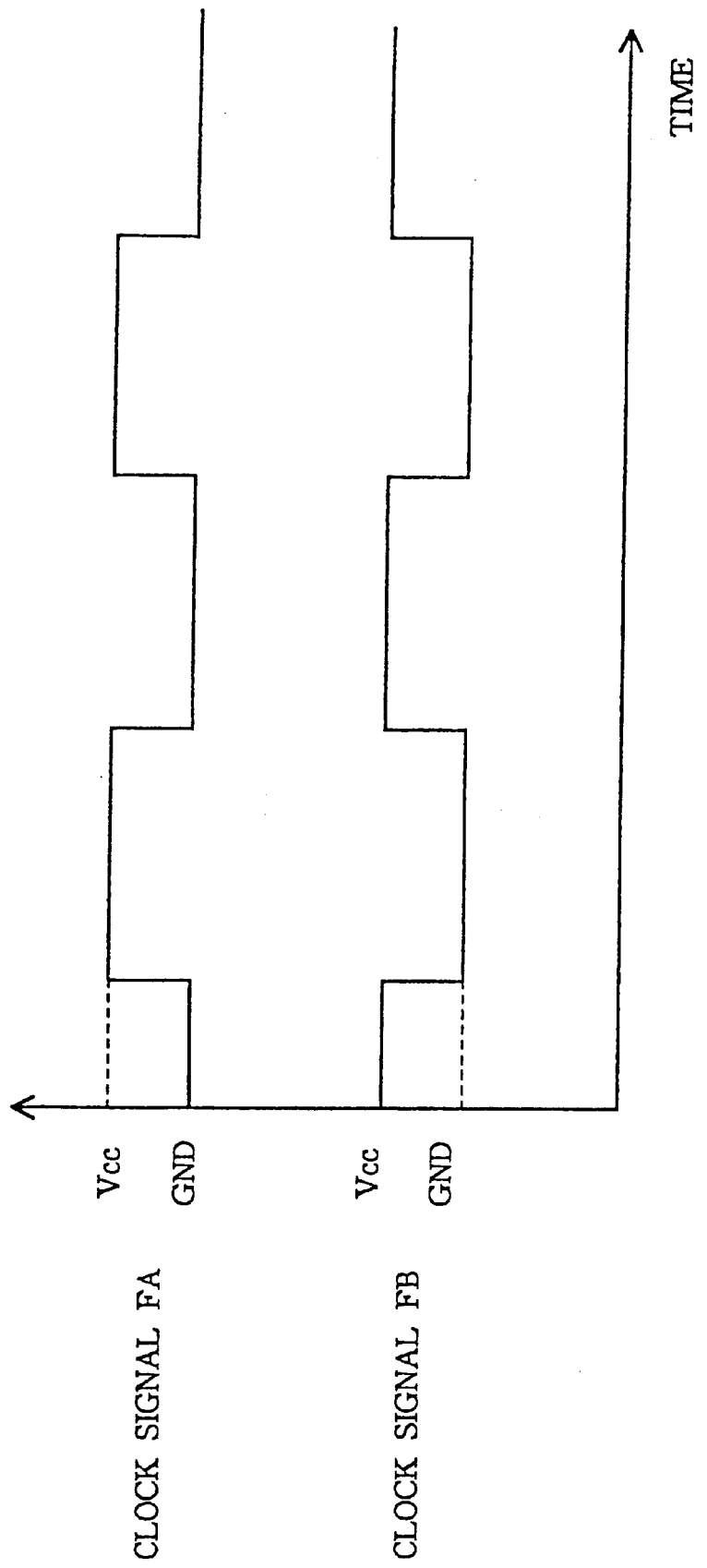
FIG. 4 is a timing chart showing the circuit behavior of the prior art charge pump circuit.

For example, the non-volatile memory cell shown in FIG. 1 is available for the capacitor C1/C2/C3. In this instance, the floating gate electrode 5 is, by way of example, connected to the boosted node A1, and the clock signal FA is supplied to the control gate electrode 7. The reason why the floating gate electrode 5 is connected to the boosted node A1 is that the capacitance is larger than a capacitor where the control gate electrode 7 is connected to the boosted node A1. The floating gate electrode is usually formed of lightly-doped n-type polysilicon. If a positive potential is applied to the floating gate electrode 5, the lightly-doped n-type polysilicon is partially depleted, and the depletion layer decreases the capacitance between the floating gate electrode 5 and the control gate electrode 7. On the other hand, the floating gate electrode 5 connected to the boosted node A1 is free from the depletion layer, and the capacitance is larger than that of the capacitor oppositely connected.

A charge pump circuit may generate a positive boosted voltage. P-channel type field effect transistors may form a charge pump circuit together with capacitors.

The n-channel enhancement type field effect transistor MN0 may have the layout similar to that for the n-channel enhancement type field effect transistor MN1 shown in FIG. 11 or 13.

What is claimed is:

1. A charge pump circuit comprising:
   a plurality of nodes independently variable in potential level;
   a diode circuit including a first field effect transistor connected between one of said plurality of nodes and a source of constant voltage and having
      a diode connected between a back gate and a positive power supply line;
      the first back gate also being connected to said one of said plurality of nodes and supplied with a first potential for restricting a back-gate biasing effect in said first field effect transistor and
      a first gate electrode connected to said one of said plurality of nodes and responsive to said first potential for creating a first current path from said one of said plurality of nodes to said source of constant voltage; and
   a plurality of boosting stages connected in series between said plurality of nodes and responsive to first clock signals for selectively boosting the potentials at said plurality of nodes and selectively discharging said potentials toward said diode circuit, each of said plurality of boosting stages including a second field effect transistor connected between two nodes selected from said plurality of nodes and having a second back gate connected to the positive power supply line via a second diode and electrically isolated from said first back gate, connected to one of said two nodes farther from said one of said plurality of nodes than the other of said two nodes and supplied with a second potential independently varied for restricting said back-gate biasing effect in said second field effect transistor and a second gate electrode connected to said one of said two nodes and responsive to said second potential for creating a second current path from said one of said two nodes to said other of said two nodes, and a first capacitor connected to said other of said two nodes and responsive to one of said first clock signals for boosting the potential at said other of said two nodes.

2. The charge pump circuit as set forth in claim 1, in which said first field effect transistor and said second field effect transistor are respectively fabricated on a first well opposite in conductivity type to a first conductive channel serving as said first current path and a second well electrically isolated from said first well and opposite in conductivity type to a second conductive channel serving as said second current path, and said first well and said second well serve as said first back gate and said second back gate, respectively.

3. The charge pump circuit as set forth in claim 2, in which said first field effect transistor and said second field effect transistor are operative in an enhancement mode for independently creating said first conductive channel and said second conductive channel both featured by a donor, and a negative voltage is generated at another of said plurality of nodes serving as an output node.

4. The charge pump circuit as set forth in claim 2, in which said first well and said second well form a first p-n junction and a second p-n junction together with a first source region of said first field effect transistor and a second source region of said second field effect transistor, respectively, and said first p-n junction and said second p-n junction are forwardly biased with said first potential and said second potential so that said first well and said second well respectively offer a third current path and a fourth current path in parallel to said first current path and said second current path, respectively.

5. The charge pump circuit as set forth in claim 4, in which said first well and said second well are electrically connected through a first contact region and a second contact region to said one of said plurality of nodes and said one of said two nodes, respectively, and said first field effect transistor and said second field effect transistor are respectively surrounded by said first contact region and said second contact region.

6. The charge pump circuit as set forth in claim 5, in which one of said first and second gate electrodes is bifurcated so as to provided one of said first and second conductive channels between a drain region of one of said first and second field effect transistors and two source sub-regions of one of said first and second source regions formed on both sides of said drain region.

7. The charge pump circuit as set forth in claim 5, in which said first gate electrode is bifurcated so as to provided said first conductive channel between a first drain region of said first field effect transistor and two source sub-regions of said first source region formed on both sides of said first drain region, and said second gate electrode is bifurcated so as to provided said second conductive channel between a second drain region of said second field effect transistor and two source sub-regions of said second source region formed on both sides of said second drain region.

8. A charge pump circuit comprising:

a plurality of nodes independently variable in potential level;

a diode circuit including a first field effect transistor connected between one of said plurality of nodes and a source of constant voltage and having a first back gate connected to said one of said plurality of nodes and supplied with a first potential for restricting a back-gate biasing effect in said first field effect transistor and a first gate electrode connected to said one of said plurality of nodes and responsive to said first potential for creating a first current path from said one of said plurality of nodes to said source of constant voltage; and a plurality of boosting stages connected in series between said plurality of nodes and responsive to first clock signals for selectively boosting the potentials at said plurality of nodes and selectively discharging said potentials toward said diode circuit, each of said plurality of boosting stages including a second field effect transistor connected between two nodes selected from said plurality of nodes and having a second back gate electrically isolated from said first back gate, connected to one of said two nodes farther from said one of said plurality of nodes than the other of said two nodes and supplied with a second potential independently varied for restricting said back-gate biasing effect in said second field effect transistor and a second gate electrode connected to said one of said two nodes and responsive to said second potential for creating a second current path from said one of said two nodes to said other of said two nodes, and a first capacitor connected to said other of said two nodes and responsive to one of said first clock signals for boosting the potential at said other of said two nodes in which said first field effect transistor and said second field effect transistor are respectively fabricated on a first well opposite in conductivity type to a first conductive channel serving as said first current path and a second well electrically isolated from said first well and opposite in conductivity type to a second conductive channel serving as said second current path, and said first well and said second well serve as said first back gate and said second back gate, respectively, in which said first well and said second well are formed in a first surface portion and a second surface portion of a third well opposite in conductivity type to said first and second wells and spaced from each other, said third well is formed in a surface portion of a semiconductor substrate, and p-n junctions between said first and second wells and said third well are reversely biased.

9. The charge pump circuit as set forth in claim 8, in which a channel stopper is formed in said third well in such a manner as to surround said first well and said second well for restricting a surface leakage current from said first and second wells to said semiconductor substrate.

10. The charge pump circuit as set forth in claim 1, in which said each of said plurality of boosting stages further includes
- a second capacitor connected to said second gate electrode and responsive to one of second clock signals for periodically boosting a potential level at said second gate electrode, and
- a third field effect transistor connected between said second gate electrode and said one of said two nodes and responsive to the potential level at said other of said two nodes for connecting said second gate electrode to said one of said two nodes, a back gate of the third field effect transistor being connected to said one of said two nodes.

11. The charge pump circuit as set forth in claim 10, in which said first field effect transistor, said second field effect transistor and said third field effect transistor are operative in an enhancement mode for creating conductive channels featured by a donor.

12. A charge pump circuit comprising:
- a plurality of nodes independently variable in potential level;
- a diode circuit including a first field effect transistor connected between one of said plurality of nodes and a source of constant voltage and having
  - a first back gate connected to said one of said plurality of nodes and supplied with a first potential for restricting a back-gate biasing effect in said first field effect transistor and
  - a first gate electrode connected to said one of said plurality of nodes and responsive to said first potential for creating a first current path from said one of said plurality of nodes to said source of constant voltage; and
- a plurality of boosting stages connected in series between said Plurality of nodes and responsive to first clock signals for selectively boosting the potentials at said plurality of nodes and selectively discharging said potentials toward said diode circuit, each of said plurality of boosting stages including
  - a second field effect transistor connected between two nodes selected from said plurality of nodes and having
    - a second back gate electrically isolated from said first back gate, connected to one of said two nodes farther from said one of said plurality of nodes than the other of said two nodes and supplied with a second potential independently varied for restricting said back-gate biasing effect in said second field effect transistor and
    - a second gate electrode connected to said one of said two nodes and responsive to said second potential for creating a second current path from said one of said two nodes to said other of said two nodes, and
  - a first capacitor connected to said other of said two nodes and responsive to one of said first clock signals for boosting the potential at said other of said two nodes,
  in which said each of said plurality of boosting stages further includes
  - a second capacitor connected to said second gate electrode and responsive to one of second clock signals for periodically boosting a potential level at said second gate electrode, and
  - a third field effect transistor connected between said second gate electrode and said one of said two nodes and responsive to the potential level at said other of said two nodes for connecting said second gate electrode to said one of said two nodes,
  in which said each of said plurality of boosting stages further includes
  - a fourth field effect transistor connected between said one of said two nodes and said second gate electrode and responsive to the potential level at said second gate electrode for connecting said second gate electrode to said one of said two nodes.

13. The charge pump as set forth in claim 12, in which said first field effect transistor, said second field effect transistor, said third field effect transistor and said forth field effect transistor are operative in an enhancement mode for creating conductive channels featured by a donor.

14. The charge pump circuit as set forth in claim 3, in which said negative voltage is supplied to an electrically erasable read only memory cell.

* * * * *